(12) United States Patent
Zhang et al.

(10) Patent No.: US 10,511,266 B2
(45) Date of Patent: Dec. 17, 2019

(54) POWER AMPLIFIER CONTROL METHOD AND APPARATUS, AND POWER AMPLIFIER CONTROL SYSTEM

(71) Applicant: Huawei Technologies Co., Ltd., Shenzhen, Guangdong (CN)

(72) Inventors: Lipeng Zhang, Shanghai (CN); Zhonghua Cai, Shanghai (CN); Kaizhan Wang, Shanghai (CN); Wei Jiao, Shanghai (CN); Zhiyuan Pang, Shanghai (CN); Sheng Zhu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/016,394

(22) Filed: Jun. 22, 2018

(65) Prior Publication Data

US 2018/0302042 A1 Oct. 18, 2018

Related U.S. Application Data

(63) Continuation of application No. PCT/CN2015/098723, filed on Dec. 24, 2015.

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/0222* (2013.01); *H03F 1/3282* (2013.01);
(Continued)

(58) Field of Classification Search
CPC ................................. H03F 1/0288; H03F 3/68
(Continued)

(56) References Cited

U.S. PATENT DOCUMENTS 8,274,332 B2 9/2012 Cho et al.
2010/0128775 A1 5/2010 Kim et al.
(Continued)

FOREIGN PATENT DOCUMENTS

CN 1866733 A 11/2006
CN 101527545 A 9/2009
(Continued)

OTHER PUBLICATIONS

Moon, Junghwan, et al.,"Doherty Amplifier with Envelope Tracking for High Efficiency," IEEE, 2010, 4 pages.
(Continued)

*Primary Examiner* — Steven J Mottola
(74) *Attorney, Agent, or Firm* — Conley Rose, P.C.

(57) ABSTRACT

A power amplifier control method is disclosed. A phase modulation control signal may be generated according to an envelope signal that is output by a baseband unit. The phase modulation may be performed on a signal of a main power amplifier link and/or an auxiliary power amplifier link in the Doherty power amplifier circuit according to the phase modulation control signal, so that a phase difference between the signal of the main power amplifier link and the signal of the auxiliary power amplifier link after the phase modulation is a specified value corresponding to a current value of the envelope signal, where the specified value is an optimal phase value of a Doherty power amplifier circuit when the supply voltage of the Doherty power amplifier circuit is an envelope voltage corresponding to the current value of the envelope signal. High-efficiency power amplifier technology is realized.

20 Claims, 13 Drawing Sheets

(51) Int. Cl.
*H03F 3/19* (2006.01)
*H03F 3/21* (2006.01)
*H03F 1/32* (2006.01)
*H03F 1/56* (2006.01)
*H03F 3/24* (2006.01)
*H03F 3/60* (2006.01)

(52) U.S. Cl.
CPC ............... *H03F 1/56* (2013.01); *H03F 3/19* (2013.01); *H03F 3/211* (2013.01); *H03F 3/245* (2013.01); *H03F 3/602* (2013.01); *H03F 2200/102* (2013.01); *H03F 2200/336* (2013.01); *H03F 2200/408* (2013.01); *H03F 2200/423* (2013.01); *H03F 2200/451* (2013.01)

(58) Field of Classification Search
USPC ............................................. 330/124 R, 295
See application file for complete search history.

(56) References Cited

U.S. PATENT DOCUMENTS

| | | | |
|---|---|---|---|
| 2011/0148518 | A1 | 6/2011 | Lejon et al. |
| 2012/0299659 | A1 | 11/2012 | Sankalp et al. |
| 2013/0181773 | A1 | 7/2013 | Liu |
| 2015/0340996 | A1 | 11/2015 | Ge et al. |
| 2015/0349720 | A1 | 12/2015 | Staudinger et al. |
| 2017/0279411 | A1* | 9/2017 | Wang ................... H03F 1/0205 |

FOREIGN PATENT DOCUMENTS

| | | |
|---|---|---|
| CN | 101567665 A | 10/2009 |
| CN | 201426111 Y | 3/2010 |
| CN | 102299689 A | 12/2011 |
| CN | 103178786 A | 6/2013 |
| CN | 103430603 A | 12/2013 |
| EP | 2357725 A1 | 8/2011 |
| JP | 2002124840 A | 4/2002 |
| JP | 2007134994 A | 5/2007 |
| JP | 2009260658 A | 11/2009 |
| JP | 2015073270 A | 4/2015 |
| JP | 2015220680 A | 12/2015 |

OTHER PUBLICATIONS

Darraji, Ramzi, et al., "High Efficiency Doherty Amplifier Combining Digital Adaptive Power Distribution and Dynamic Phase Alignment," 2013, Crown, 3 pages.
Machine Translation and Abstract of Japanese Publication No. JP2002124840, dated Apr. 26, 2002, 30 pages.
Machine Translation and Abstract of Japanese Publication No. JP2007134994, dated May 31, 2007, 11 pages.
Machine Translation and Abstract of Japanese Publication No. JP2009260658, dated Nov. 5, 2009, 23 pages.
Machine Translation and Abstract of Japanese Publication No. JP2015220680, dated Dec. 7, 2015, 49 pages.
Foreign Communication From a Counterpart Application, Japanese Application No. 2018-533252, Japanese Office Action dated Jun. 1, 2019, 6 pages.
Foreign Communication From a Counterpart Application, Japanese Application No. 2018-533252, English Translation pf Japanese Office Action dated Jun. 11, 2019, 7 pages.

* cited by examiner

POWER AMPLIFIER CONTROL METHOD AND APPARATUS, AND POWER AMPLIFIER CONTROL SYSTEM

CROSS-REFERENCE TO RELATED APPLICATIONS

This application is a continuation of International Application No. PCT/CN2015/098723, filed on Dec. 24, 2015, the disclosure of which is hereby incorporated by reference in its entirety.

TECHNICAL FIELD

The present application relates to the field of wireless communications, and in particular, to a power amplifier control method and apparatus, and a power amplifier control system.

BACKGROUND

To increase spectrum usage efficiency, in wireless communications, modulation signals of a plurality of different standards, for example, OFDM (Orthogonal Frequency Division Multiplexing), CDMA (Code Division Multiple Access), and TDMA (Time Division Multiple Access) are used. However, using OFDM as an example, a signal of OFDM has a relatively high peak-to-average ratio, and therefore, OFDM has a relatively high requirement on a power amplifier of a base station. To amplify, without distortion, these signals having a high peak-to-average ratio, the power amplifier of the base station may use two manners. One manner is power back-off, that is, an operating state of the power amplifier is set to a class A or a class AB. However, because a feature of a power amplifier transistor is limited, this manner causes efficiency of the power amplifier to decrease sharply, and in a case of same output power, causes the base station to consume more energy. The other manner is a high-efficiency power amplifier technology. In this manner, not only relatively high efficiency of the power amplifier can be achieved, but also linearity of the power amplifier can meet a requirement of a related protocol.

Currently, high-efficiency power amplifier technologies commonly used in the industry may include a Doherty technology and an ET (envelope tracking) technology, and specifically may be classified into the following three types:

1. High-efficiency power amplifier technology based on a conventional ET power amplifier. As shown in FIG. 1, generally the ET power amplifier may include one envelope modulator and one class-AB power amplifier. The envelope modulator generates an envelope voltage to replace a fixed voltage to supply power to the power amplifier, so as to perform envelope tracking on the power amplifier, so that the power amplifier is always in a near-saturation operating state, and back-off operating efficiency is increased.

However, overall operating efficiency of the ET power amplifier is equal to a product of operating efficiency of the envelope modulator and operating efficiency of the power amplifier, and the operating efficiency of the envelope modulator is impossible to reach 100%. Therefore, there is an efficiency loss. In particular, when a modulation signal has a high peak-to-average ratio, due to a limitation of the power amplifier, it is very difficult for the back-off efficiency to reach very high. In addition, once the envelope voltage is excessively low, a gain of a power tube is reduced sharply, and PAE (power added efficiency) is also further reduced. Consequently, this manner has a poor power amplifier effect and poor power amplifier performance.

2. High-efficiency power amplifier technology based on a Doherty ET power amplifier with independent feed. As shown in FIG. 2, the Doherty ET power amplifier may include an envelope modulator, a Doherty main power amplifier, and a Doherty auxiliary power amplifier (that is, a peak power amplifier). The envelope modulator is connected to the main power amplifier, to perform envelope tracking on the main power amplifier, and power is supplied to the auxiliary power amplifier by using a fixed voltage, so that back-off efficiency of a signal having a high peak-to-average ratio can be increased by using an advantage of back-off efficiency of the Doherty power amplifier.

However, a larger ratio of a voltage of the Doherty main power amplifier to a voltage of the Doherty auxiliary power amplifier indicates higher asymmetry of Doherty power amplifier, and a larger dent of power amplifier efficiency. Therefore, in this manner, an efficiency increase is limited, and a very high voltage cannot be configured for the Doherty auxiliary power amplifier due to impact of a breakdown voltage of a power tube. Therefore, there is a problem that saturation power of the power amplifier cannot be further increased. Consequently, this manner also has a poor power amplifier effect and poor power amplifier performance.

3. High-efficiency power amplifier technology based on a Doherty ET power amplifier with separate feed. As shown in FIG. 3, in this case, the Doherty ET power amplifier may include an envelope modulator, a Doherty main power amplifier, and a Doherty auxiliary power amplifier. The envelope modulator is connected to both the main power amplifier and the auxiliary power amplifier, to separately perform envelope tracking on the Doherty main power amplifier and the Doherty auxiliary power amplifier, so that back-off efficiency of a signal having a high peak-to-average ratio can be increased by using an advantage of back-off efficiency of the Doherty power amplifier.

However, at different voltages, a signal of a Doherty main power amplifier link and a signal of a Doherty auxiliary power amplifier link have different phases. Therefore, a phase of a Doherty power amplifier is not optimal at different envelope voltages. Consequently, this manner has a relatively poor power amplifier effect and poor power amplifier performance.

In conclusion, the existing high-efficiency power amplifier technology has problems such as a relatively poor effect and poor performance. Therefore, a new power amplifier technology is urgently needed to resolve the foregoing problems.

SUMMARY

Embodiments of the present disclosure provide a power amplifier control method and apparatus, and a power amplifier control system, to resolve problems such as a relatively poor effect and poor performance that exist in an existing high-efficiency power amplifier technology.

According to a first aspect, a power amplifier control method is provided, and is applicable to a power amplifier system that includes an envelope control circuit and a Doherty power amplifier circuit, where the envelope control circuit includes an envelope modulator configured to: generate an envelope voltage according to an envelope signal that is output by a baseband unit, and output the envelope voltage to the Doherty power amplifier circuit as a supply voltage; the Doherty power amplifier circuit includes a main power amplifier and an auxiliary power amplifier; the main power amplifier and the auxiliary power amplifier are separately configured to perform, according to the envelope voltage that is output by the envelope modulator, amplification processing on a baseband signal that is output by the baseband unit; and the method includes:

generating a phase modulation control signal according to the envelope signal that is output by the baseband unit; and performing phase modulation on a signal of a main power amplifier link and/or an auxiliary power amplifier link in the Doherty power amplifier circuit according to the generated phase modulation control signal, so that a phase difference between the signal of the main power amplifier link and the signal of the auxiliary power amplifier link after the phase modulation is a specified value corresponding to a current value of the envelope signal, where the specified value is an optimal phase value of the Doherty power amplifier circuit when the supply voltage of the Doherty power amplifier circuit is the envelope voltage corresponding to the current value of the envelope signal.

With reference to the first aspect, in a first possible implementation of the first aspect, the generating a phase modulation control signal according to the envelope signal that is output by the baseband unit includes:

if it is determined that the current value of the envelope signal is not greater than a specified envelope opening threshold, generating a first phase modulation control signal according to the envelope signal, where the first phase modulation control signal can enable the phase difference between the signal of the main power amplifier link and the signal of the auxiliary power amplifier link after the phase modulation to be a first phase value; and the first phase value is an optimal phase value of the Doherty power amplifier circuit when the supply voltage of the Doherty power amplifier circuit is a minimum envelope voltage; or if it is determined that the current value of the envelope signal is a specified envelope signal maximum value, generating a second phase modulation control signal according to the envelope signal, where the second phase modulation control signal can enable the phase difference between the signal of the main power amplifier link and the signal of the auxiliary power amplifier link after the phase modulation to be a second phase value; the second phase value is an optimal phase value of the Doherty power amplifier circuit when the supply voltage of the Doherty power amplifier circuit is a maximum envelope voltage; and the specified envelope signal maximum value is greater than the specified envelope opening threshold; or if it is determined that the current value of the envelope signal is greater than a specified envelope opening threshold and less than a specified envelope signal maximum value, generating a third phase modulation control signal according to the envelope signal, where the third phase modulation control signal can enable the phase difference between the signal of the main power amplifier link and the signal of the auxiliary power amplifier link after the phase modulation to be a third phase value; and the third phase value is obtained by performing a linear interpolation operation according to the current value of the envelope signal, a first phase value, a second phase value, an envelope opening threshold corresponding to the first phase value, and an envelope signal maximum value corresponding to the second phase value.

With reference to the first aspect, in a second possible implementation of the first aspect, the performing phase modulation on a signal of a main power amplifier link and/or an auxiliary power amplifier link in the Doherty power amplifier circuit according to the generated phase modulation control signal includes:

after performing frequency conversion processing on a baseband signal corresponding to the main power amplifier link and/or the auxiliary power amplifier link in the Doherty power amplifier circuit, performing the phase modulation on the signal of the main power amplifier link and/or the auxiliary power amplifier link in the Doherty power amplifier circuit; or before performing frequency conversion processing on a baseband signal corresponding to the main power amplifier link and/or the auxiliary power amplifier link in the Doherty power amplifier circuit, performing the phase modulation on the signal of the main power amplifier link and/or the auxiliary power amplifier link in the Doherty power amplifier circuit.

With reference to the first aspect, in a third possible implementation of the first aspect, there is one or more auxiliary power amplifiers in the Doherty power amplifier circuit; and if there are a plurality of auxiliary power amplifiers in the Doherty power amplifier circuit, the performing phase modulation on a signal of an auxiliary power amplifier link in the Doherty power amplifier circuit includes:

performing phase modulation on a signal of each auxiliary power amplifier link in the Doherty power amplifier circuit.

With reference to the first aspect, in a fourth possible implementation of the first aspect, the envelope control circuit includes one envelope modulator separately connected to power amplifiers in the Doherty power amplifier circuit, where the one envelope modulator is configured to output an envelope voltage to the power amplifiers in the Doherty power amplifier circuit; or includes a plurality of envelope modulators connected to power amplifiers in the Doherty power amplifier circuit in a one-to-one corresponding manner, where each of the plurality of envelope modulators is configured to output an envelope voltage to a corresponding power amplifier in the Doherty power amplifier circuit.

With reference to the first aspect, in a fifth possible implementation of the first aspect, the phase modulation is digital phase modulation or analog phase modulation.

According to a second aspect, a power amplifier control apparatus is provided, and is applicable to a power amplifier system that includes an envelope control circuit and a Doherty power amplifier circuit, where the envelope control circuit includes an envelope modulator configured to: generate an envelope voltage according to an envelope signal that is output by a baseband unit, and output the envelope voltage to the Doherty power amplifier circuit as a supply voltage; the Doherty power amplifier circuit includes a main power amplifier and an auxiliary power amplifier; the main power amplifier and the auxiliary power amplifier are separately configured to perform, according to the envelope voltage that is output by the envelope modulator, amplification processing on a baseband signal that is output by the baseband unit; and the apparatus includes:

a signal generation unit, configured to generate a phase modulation control signal according to the envelope signal that is output by the baseband unit; and a signal phase modulation unit, configured to perform phase modulation on a signal of a main power amplifier link and/or an auxiliary power amplifier link in the Doherty power amplifier circuit according to the generated phase modulation control signal, so that a phase difference between the signal of the main power amplifier link and the signal of the auxiliary power amplifier link after the phase modulation is a specified value corresponding to a current value of the envelope signal, where the specified value is an optimal phase value of the Doherty power amplifier circuit when the supply voltage of the Doherty power amplifier circuit is the envelope voltage corresponding to the current value of the envelope signal.

With reference to the second aspect, in a first possible implementation of the second aspect, the signal generation unit is specifically configured to: if it is determined that the current value of the envelope signal is not greater than a specified envelope opening threshold, generate a first phase modulation control signal according to the envelope signal, where the first phase modulation control signal can enable the phase difference between the signal of the main power amplifier link and the signal of the auxiliary power amplifier link after the phase modulation to be a first phase value; and the first phase value is an optimal phase value of the Doherty power amplifier circuit when the supply voltage of the Doherty power amplifier circuit is a minimum envelope voltage; or if it is determined that the current value of the envelope signal is a specified envelope signal maximum value, generate a second phase modulation control signal according to the envelope signal, where the second phase modulation control signal can enable the phase difference between the signal of the main power amplifier link and the signal of the auxiliary power amplifier link after the phase modulation to be a second phase value; the second phase value is an optimal phase value of the Doherty power amplifier circuit when the supply voltage of the Doherty power amplifier circuit is a maximum envelope voltage; and the specified envelope signal maximum value is greater than the specified envelope opening threshold; or if it is determined that the current value of the envelope signal is greater than a specified envelope opening threshold and less than a specified envelope signal maximum value, generate a third phase modulation control signal according to the envelope signal, where the third phase modulation control signal can enable the phase difference between the signal of the main power amplifier link and the signal of the auxiliary power amplifier link after the phase modulation to be a third phase value; and the third phase value is obtained by performing a linear interpolation operation according to the current value of the envelope signal, a first phase value, a second phase value, an envelope opening threshold corresponding to the first phase value, and an envelope signal maximum value corresponding to the second phase value.

With reference to the second aspect, in a second possible implementation of the second aspect, the signal phase modulation unit is specifically configured to: after performing frequency conversion processing on a baseband signal corresponding to the main power amplifier link and/or the auxiliary power amplifier link in the Doherty power amplifier circuit, perform the phase modulation on the signal of the main power amplifier link and/or the auxiliary power amplifier link in the Doherty power amplifier circuit; or before performing frequency conversion processing on a baseband signal corresponding to the main power amplifier link and/or the auxiliary power amplifier link in the Doherty power amplifier circuit, perform the phase modulation on the signal of the main power amplifier link and/or the auxiliary power amplifier link in the Doherty power amplifier circuit.

With reference to the second aspect, in a third possible implementation of the second aspect, there is one or more auxiliary power amplifiers in the Doherty power amplifier circuit; and the signal phase modulation unit is specifically configured to: when there are a plurality of auxiliary power amplifiers in the Doherty power amplifier circuit, and phase modulation needs to be performed on signals of the auxiliary power amplifier links in the Doherty power amplifier circuit, perform phase modulation on a signal of each auxiliary power amplifier link in the Doherty power amplifier circuit.

With reference to the second aspect, in a fourth possible implementation of the second aspect, the envelope control circuit includes one envelope modulator separately connected to power amplifiers in the Doherty power amplifier circuit, where the one envelope modulator is configured to output an envelope voltage to the power amplifiers in the Doherty power amplifier circuit; or includes a plurality of envelope modulators connected to power amplifiers in the Doherty power amplifier circuit in a one-to-one corresponding manner, where each of the plurality of envelope modulators is configured to output an envelope voltage to a corresponding power amplifier in the Doherty power amplifier circuit.

With reference to the second aspect, in a fifth possible implementation of the second aspect, the phase modulation is digital phase modulation or analog phase modulation.

According to a third aspect, a power amplifier control apparatus is provided, and is applicable to a power amplifier system that includes an envelope control circuit and a Doherty power amplifier circuit, where the envelope control circuit includes an envelope modulator configured to: generate an envelope voltage according to an envelope signal that is output by a baseband unit, and output the envelope voltage to the Doherty power amplifier circuit as a supply voltage; the Doherty power amplifier circuit includes a main power amplifier and an auxiliary power amplifier; the main power amplifier and the auxiliary power amplifier are separately configured to perform, according to the envelope voltage that is output by the envelope modulator, amplification processing on a baseband signal that is output by the baseband unit; and the apparatus includes:

a signal generator, configured to generate a phase modulation control signal according to the envelope signal that is output by the baseband unit; and a signal modulator, configured to perform phase modulation on a signal of a main power amplifier link and/or an auxiliary power amplifier link in the Doherty power amplifier circuit according to the generated phase modulation control signal, so that a phase difference between the signal of the main power amplifier link and the signal of the auxiliary power amplifier link after the phase modulation is a specified value corresponding to a current value of the envelope signal, where the specified value is an optimal phase value of the Doherty power amplifier circuit when the supply voltage of the Doherty power amplifier circuit is the envelope voltage corresponding to the current value of the envelope signal.

With reference to the third aspect, in a first possible implementation of the third aspect, the signal generator is specifically configured to: if it is determined that the current value of the envelope signal is not greater than a specified envelope opening threshold, generate a first phase modulation control signal according to the envelope signal, where the first phase modulation control signal can enable the phase difference between the signal of the main power amplifier link and the signal of the auxiliary power amplifier link after the phase modulation to be a first phase value; and the first phase value is an optimal phase value of the Doherty power amplifier circuit when the supply voltage of the Doherty power amplifier circuit is a minimum envelope voltage; or if it is determined that the current value of the envelope signal is a specified envelope signal maximum value, generate a second phase modulation control signal according to the envelope signal, where the second phase modulation control signal can enable the phase difference between the signal of the main power amplifier link and the signal of the auxiliary power amplifier link after the phase modulation to be a second phase value; the second phase value is an optimal phase value of the Doherty power amplifier circuit when the supply voltage of the Doherty power amplifier circuit is a maximum envelope voltage; and the specified envelope signal maximum value is greater than the specified envelope opening threshold; or if it is determined that the current value of the envelope signal is greater than a specified envelope opening threshold and less than a specified envelope signal maximum value, generate a third phase modulation control signal according to the envelope signal, where the third phase modulation control signal can enable the phase difference between the signal of the main power amplifier link and the signal of the auxiliary power amplifier link after the phase modulation to be a third phase value; and the third phase value is obtained by performing a linear interpolation operation according to the current value of the envelope signal, a first phase value, a second phase value, an envelope opening threshold corresponding to the first phase value, and an envelope signal maximum value corresponding to the second phase value.

With reference to the third aspect, in a second possible implementation of the third aspect, the signal modulator is specifically configured to: after performing frequency conversion processing on a baseband signal corresponding to the main power amplifier link and/or the auxiliary power amplifier link in the Doherty power amplifier circuit, perform the phase modulation on the signal of the main power amplifier link and/or the auxiliary power amplifier link in the Doherty power amplifier circuit; or before performing frequency conversion processing on a baseband signal corresponding to the main power amplifier link and/or the auxiliary power amplifier link in the Doherty power amplifier circuit, perform the phase modulation on the signal of the main power amplifier link and/or the auxiliary power amplifier link in the Doherty power amplifier circuit.

With reference to the third aspect, in a third possible implementation of the third aspect, there is one or more auxiliary power amplifiers in the Doherty power amplifier circuit; and the signal modulator is specifically configured to: when there are a plurality of auxiliary power amplifiers in the Doherty power amplifier circuit, and phase modulation needs to be performed on signals of the auxiliary power amplifier links in the Doherty power amplifier circuit, perform phase modulation on a signal of each auxiliary power amplifier link in the Doherty power amplifier circuit.

With reference to the third aspect, in a fourth possible implementation of the third aspect, the envelope control circuit includes one envelope modulator separately connected to power amplifiers in the Doherty power amplifier circuit, where the one envelope modulator is configured to output an envelope voltage to the power amplifiers in the Doherty power amplifier circuit; or includes a plurality of envelope modulators connected to power amplifiers in the Doherty power amplifier circuit in a one-to-one corresponding manner, where each of the plurality of envelope modulators is configured to output an envelope voltage to a corresponding power amplifier in the Doherty power amplifier circuit.

With reference to the third aspect, in a fifth possible implementation of the third aspect, the phase modulation is digital phase modulation or analog phase modulation.

According to a fourth aspect, a power amplifier control system is provided, including a power amplifier system that includes an envelope control circuit and a Doherty power amplifier circuit, where the envelope control circuit includes an envelope modulator configured to: generate an envelope voltage according to an envelope signal that is output by a baseband unit, and output the envelope voltage to the Doherty power amplifier circuit as a supply voltage; the Doherty power amplifier circuit includes a main power amplifier and an auxiliary power amplifier; the main power amplifier and the auxiliary power amplifier are separately configured to perform, according to the envelope voltage that is output by the envelope modulator, amplification processing on a baseband signal that is output by the baseband unit; and the power amplifier control system further includes the power amplifier control apparatus according to any one of the second aspect or the first to the fifth possible implementations of the second aspect.

According to the power amplifier control method and apparatus, and the power amplifier control system that are provided according to the first aspect to the fourth aspect, the phase modulation control signal may be generated according to the envelope signal that is output by the baseband unit; and the phase modulation may be performed on the signal of the main power amplifier link and/or the auxiliary power amplifier link in the Doherty power amplifier circuit according to the phase modulation control signal, so that the phase difference between the signal of the main power amplifier link and the signal of the auxiliary power amplifier link after the phase modulation is the specified value corresponding to the current value of the envelope signal, where the specified value is the optimal phase value of the Doherty power amplifier circuit when the supply voltage of the Doherty power amplifier circuit is the envelope voltage corresponding to the current value of the envelope signal. That is, phase compensation may be performed, for different envelope voltages, on the main power amplifier link and/or the auxiliary power amplifier link, so that at the different envelope voltages, the phase difference between the main power amplifier link and the auxiliary power amplifier link in the Doherty power amplifier circuit can be optimized, thereby improving an effect and performance of the power amplifiers.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DESCRIPTION OF EMBODIMENTS

To make the objectives, technical solutions, and advantages of the present disclosure clearer, the following further describes the present disclosure in detail with reference to the accompanying drawings. Apparently, the described embodiments are merely a part rather than all of the embodiments of the present disclosure. All other embodiments obtained by persons of ordinary skill in the art based on the embodiments of the present disclosure without creative efforts shall fall within the protection scope of the present disclosure.

Embodiment 1

Figure 1:
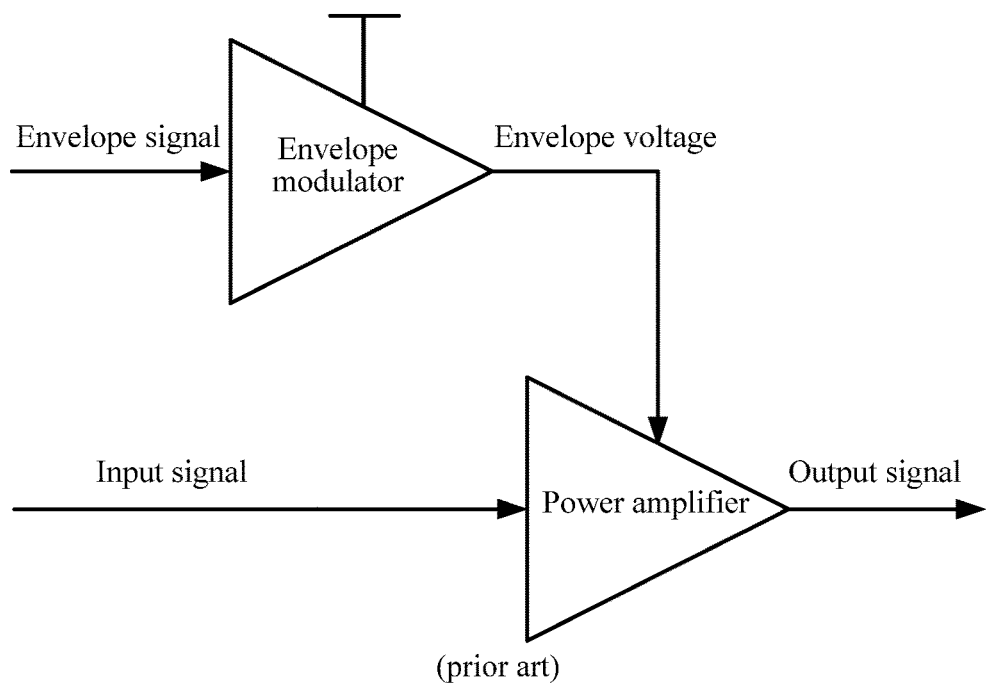
FIG. 1 is a schematic structural diagram of a conventional ET power amplifier in the prior art.
Figure 2:
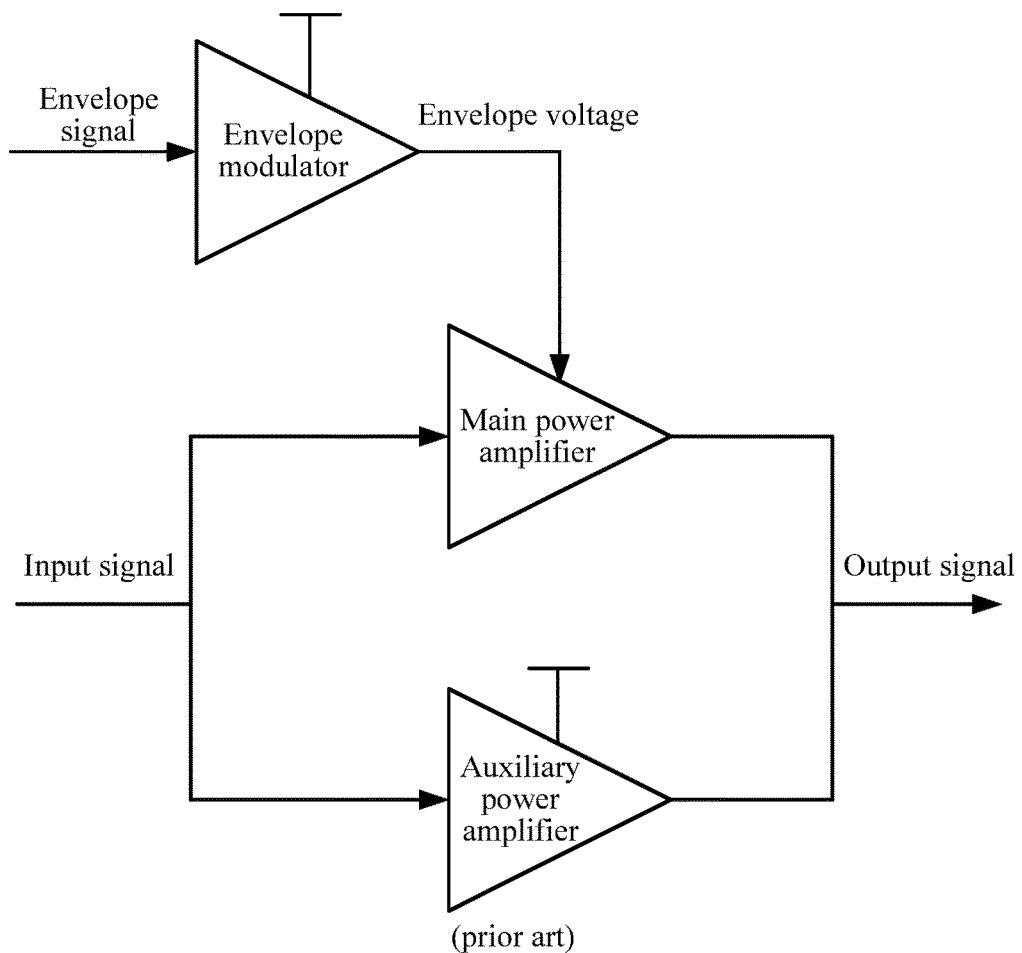
FIG. 2 is a schematic structural diagram of a Doherty ET power amplifier with independent feed in the prior art.
Figure 3:
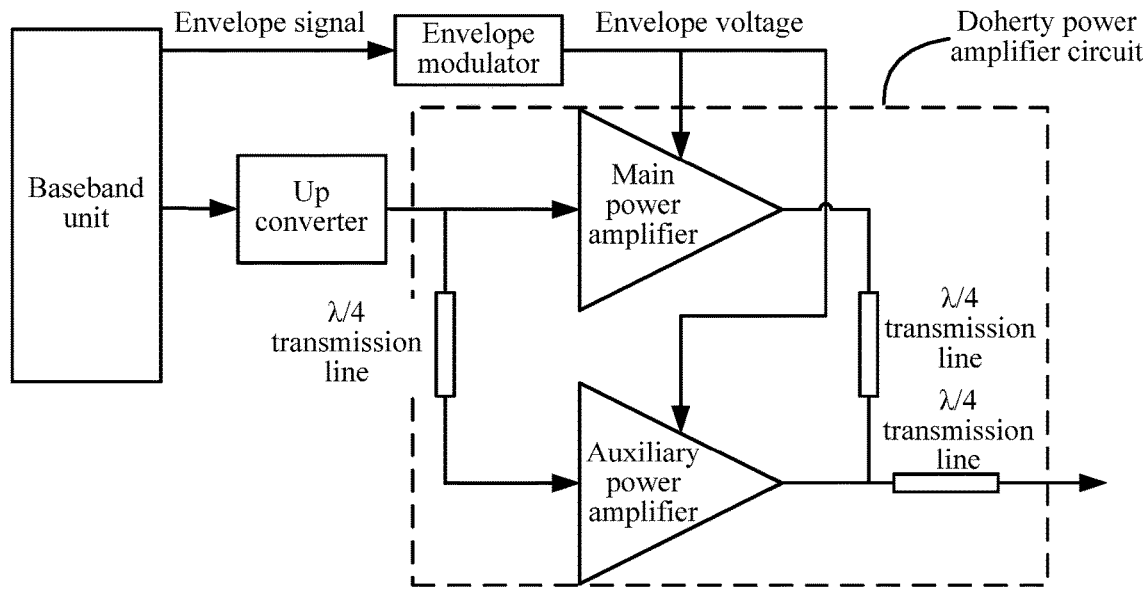
FIG. 3 is a schematic structural diagram of a Doherty ET power amplifier with separate feed in the prior art.
Figure 4:
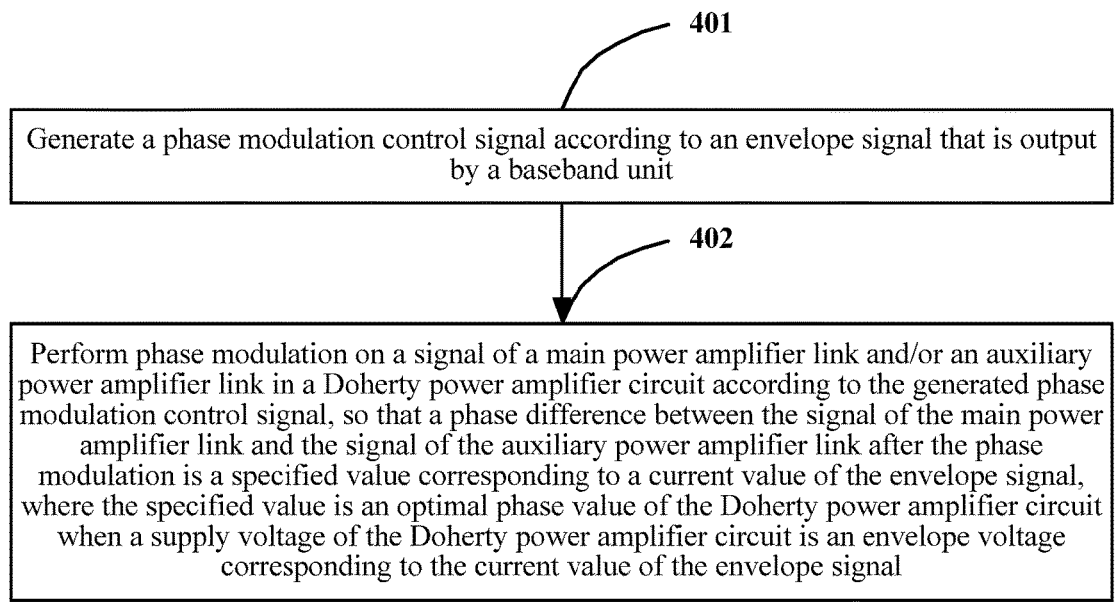
FIG. 4 is a schematic flowchart of a power amplifier control method according to Embodiment 1 of the present disclosure.

To resolve problems such as a relatively poor effect and poor performance that exist in an existing high-efficiency power amplifier technology, Embodiment 1 of the present disclosure provides a power amplifier control method. As shown in FIG. 4, FIG. 4 is a schematic flowchart of a power amplifier control method according to Embodiment 1 of the present disclosure. The power amplifier control method is applicable to a power amplifier system that includes an envelope control circuit and a Doherty power amplifier circuit. The envelope control circuit includes an envelope modulator configured to: generate an envelope voltage according to an envelope signal that is output by a baseband unit, and output the envelope voltage to the Doherty power amplifier circuit as a supply voltage. The Doherty power amplifier circuit includes a main power amplifier and an auxiliary power amplifier. The main power amplifier and the auxiliary power amplifier are separately configured to perform, according to the envelope voltage that is output by the envelope modulator, amplification processing on a baseband signal that is output by the baseband unit. Specifically, the control method may include the following steps:

Step 401: Generate a phase modulation control signal according to the envelope signal that is output by the baseband unit.

Step 402: Perform phase modulation on a signal of a main power amplifier link and/or an auxiliary power amplifier link in the Doherty power amplifier circuit according to the generated phase modulation control signal, so that a phase difference between the signal of the main power amplifier link and the signal of the auxiliary power amplifier link after the phase modulation is a specified value corresponding to a current value of the envelope signal, where the specified value is an optimal phase value of the Doherty power amplifier circuit when the supply voltage of the Doherty power amplifier circuit is the envelope voltage corresponding to the current value of the envelope signal.

That is, when the phase modulation is performed on the Doherty power amplifier circuit according to the generated phase modulation control signal, the phase modulation may be performed only on the signal of the main power amplifier link, and a phase of the signal of the auxiliary power amplifier link remains unchanged; or the phase modulation may be performed only on the signal of the auxiliary power amplifier link, and a phase of the signal of the main power amplifier link remains unchanged; or the phase modulation may be performed on both the signal of the main power amplifier link and the signal of the auxiliary power amplifier link. That is, a power amplifier link that requires the phase modulation may be selected according to an actual requirement, as long as it is ensured that the phase difference between the signal of the Doherty main power amplifier link and the signal of the Doherty auxiliary power amplifier link reaches a required value. Details are not described.

It can be learned from the content in this embodiment of the present disclosure that, the phase modulation may be performed on the signal of the main power amplifier link and/or the auxiliary power amplifier link in the Doherty power amplifier circuit by using the generated phase modulation control signal, so that the phase difference between the signal of the main power amplifier link in the Doherty power amplifier circuit and the signal of the auxiliary power amplifier link in the Doherty power amplifier circuit reaches an optimal phase of the Doherty power amplifier circuit at an envelope voltage value corresponding to the current envelope signal. That is, phase compensation may be performed, for different envelope voltages, on the main power amplifier link and/or the auxiliary power amplifier link, so that at the different envelope voltages, the phase difference between the main power amplifier link and the auxiliary power amplifier link can each reach a corresponding optimal value, thereby improving an effect and performance of a power amplifier, and resolving problems such as a relatively poor effect and poor performance that exist in an existing high-efficiency power amplifier technology.

Optionally, the generating a phase modulation control signal according to the envelope signal that is output by the baseband unit in step 401 may include:

if it is determined that the current value of the envelope signal is not greater than a specified envelope opening threshold, generating a first phase modulation control signal according to the envelope signal, where the first phase modulation control signal can enable the phase difference between the signal of the main power amplifier link and the signal of the auxiliary power amplifier link after the phase modulation to be a first phase value; and the first phase value is an optimal phase value of the Doherty power amplifier circuit when the supply voltage of the Doherty power amplifier circuit is a minimum envelope voltage; or if it is determined that the current value of the envelope signal is a specified envelope signal maximum value, generating a second phase modulation control signal according to the envelope signal, where the second phase modulation control signal can enable the phase difference between the signal of the main power amplifier link and the signal of the auxiliary power amplifier link after the phase modulation to be a second phase value; the second phase value is an optimal phase value of the Doherty power amplifier circuit when the supply voltage of the Doherty power amplifier circuit is a maximum envelope voltage; and the specified envelope signal maximum value is greater than the specified envelope opening threshold; or if it is determined that the current value of the envelope signal is greater than a specified envelope opening threshold and less than a specified envelope signal maximum value, generating a third phase modulation control signal according to the envelope signal, where the third phase modulation control signal can enable the phase difference between the signal of the main power amplifier link and the signal of the auxiliary power amplifier link after the phase modulation to be a third phase value; and the third phase value is obtained by performing a linear interpolation operation according to the current value of the envelope signal, a first phase value, a second phase value, an envelope opening threshold corresponding to the first phase value, and an envelope signal maximum value corresponding to the second phase value. That is, when the envelope signal changes between the specified envelope opening threshold and the specified envelope signal maximum value, a phase modulation control signal that enables the phase difference between the signal of the main power amplifier link and the signal of the auxiliary power amplifier link to linearly change according to the envelope signal may be generated.

It should be noted that, the first phase value is the optimal phase value of the Doherty power amplifier circuit when the envelope voltage is minimum, because when the current value of the envelope signal is not greater than the specified envelope opening threshold (the threshold may be flexibly adjusted according to an actual status), the power amplifier system operates in a pure Doherty state, and the envelope modulator outputs a fixed voltage VDDL (that is, the minimum envelope voltage) to the drains of power amplifiers in the Doherty power amplifier circuit.

Similarly, the second phase value is the optimal phase value of the Doherty power amplifier circuit when the envelope voltage is maximum, because when the envelope signal is greater than the specified envelope opening threshold, the power amplifier system operates in a state of Doherty and ET at the same moment, an output voltage of the envelope modulator changes according to an envelope of the envelope signal. When the envelope signal reaches a maximum value, that is, reaches the specified envelope signal maximum value, and the envelope modulator outputs a maximum output voltage VDDH (that is, the maximum envelope voltage) to the drains of power amplifiers in the Doherty power amplifier circuit. Details are not described herein.

Figure 5:
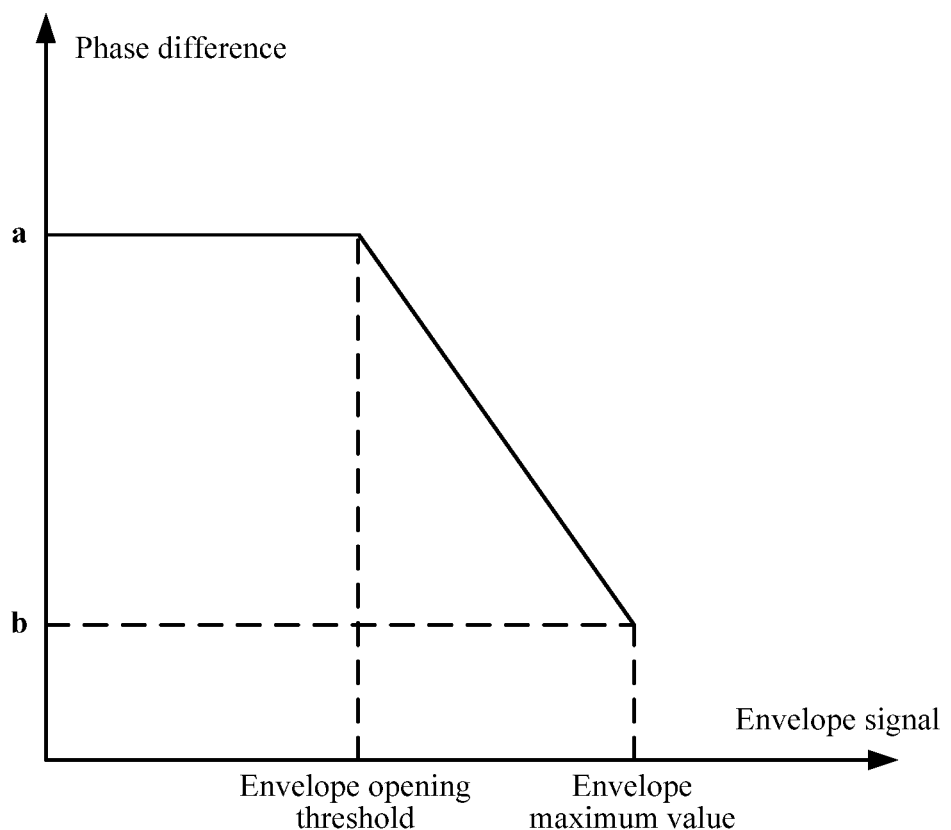
FIG. 5 is a schematic curve diagram of a relationship between a phase difference between a signal of a main power amplifier link and a signal of an auxiliary power amplifier link and an envelope signal according to Embodiment 1 of the present disclosure.

Optionally, in this embodiment of the present disclosure, the generated phase modulation control signal may be specifically a voltage signal. For example, it is assumed that the Doherty power amplifier circuit includes one main power amplifier and one auxiliary power amplifier, and the phase modulation needs to be performed on the signal of the auxiliary power amplifier link in the Doherty power amplifier circuit, and then:

when the envelope signal is not greater than the specified envelope opening threshold, the envelope modulator outputs a fixed voltage VDDL (that is, the minimum envelope voltage) to the drains of the power amplifiers in the Doherty power amplifier circuit; in addition, a power amplifier control apparatus (that is, an execution body of the steps in this embodiment of the present disclosure) generates a fixed voltage V0 according to the envelope signal that is output by the baseband unit, where the fixed voltage V0 can enable a phase of the auxiliary power amplifier link to be in a state of a phase a, that is, enable the phase difference between the main power amplifier link and the auxiliary power amplifier link in the Doherty power amplifier circuit to be a, where the phase a is an optimal phase, at the voltage VDDL, of the Doherty power amplifier circuit; or when the envelope signal is greater than the specified envelope opening threshold, the voltage that is output by the envelope modulator changes according to an envelope of the envelope signal, where a maximum envelope corresponds to a maximum output voltage VDDH (that is, the maximum envelope voltage); in addition, a voltage signal generated by a power amplifier control apparatus according to the envelope signal that is output by the baseband unit changes when the envelope changes, and when the envelope signal reaches the maximum, a voltage V1 that is output by the power amplifier control apparatus enables a phase of the auxiliary power amplifier link to be in a state of a phase b, that is, enables the phase difference between the main power amplifier link and the auxiliary power amplifier link in the Doherty power amplifier circuit to be b, where the phase b is an optimal phase, at the voltage VDDH, of the Doherty power amplifier circuit; and when the envelope signal changes between the specified envelope opening threshold and the specified envelope signal maximum value, the voltage generated by the power amplifier control apparatus according to the envelope signal that is output by the baseband unit enables the phase of the auxiliary power amplifier link to linearly change according to the envelope signal, and a specific change curve is shown in FIG. 5.

Optionally, the performing phase modulation on a signal of a main power amplifier link and/or an auxiliary power amplifier link in the Doherty power amplifier circuit according to the generated phase modulation control signal in step 402 includes:

after performing frequency conversion processing on a baseband signal corresponding to the main power amplifier link and/or the auxiliary power amplifier link in the Doherty power amplifier circuit, performing the phase modulation on the signal of the main power amplifier link and/or the auxiliary power amplifier link in the Doherty power amplifier circuit; or before performing frequency conversion processing on a baseband signal corresponding to the main power amplifier link and/or the auxiliary power amplifier link in the Doherty power amplifier circuit, performing the phase modulation on the signal of the main power amplifier link and/or the auxiliary power amplifier link in the Doherty power amplifier circuit.

That is, for one or more signals that require phase modulation, a phase modulation operation may be performed after the frequency conversion or before the frequency conversion. This is not limited in this embodiment of the present disclosure.

For example, it is assumed that the phase modulation needs to be performed on the signal of the auxiliary power amplifier link in the Doherty power amplifier circuit, the frequency conversion processing may be performed, on an up-conversion device, on the baseband signal generated by the baseband unit, to obtain a plurality of radio frequency signals in a one-to-one correspondence to the power amplifiers in the Doherty power amplifier circuit, and then phase modulation may be performed on a radio frequency signal corresponding to the auxiliary power amplifier link; in this case, to simplify a system structure, and reduce a quantity of up-conversion devices, the baseband unit may output only one baseband signal to the power amplifier system, or certainly may output a plurality of baseband signals in a one-to-one correspondence to the power amplifiers in the Doherty power amplifier circuit, and this is not limited herein; or before the frequency conversion processing is performed, on an up-conversion device, on the baseband signal generated by the baseband unit, phase modulation may be performed on the baseband signal that is generated by the baseband unit and that needs to be input to the auxiliary power amplifier link in the Doherty power amplifier circuit; in this case, the baseband unit may output a plurality of baseband signals in a one-to-one correspondence to the power amplifiers in the Doherty power amplifier circuit, or may output only two baseband signals, where one baseband signal corresponds to the main power amplifier link and the other baseband signal corresponds to all auxiliary power amplifier links; in addition, it should be noted that, phase modulation on a baseband signal corresponding to the auxiliary power amplifier link may be completed in a process of generating, by the baseband unit, the corresponding baseband signal (that is, in this case, the power amplifier control apparatus may be equivalent to being integrated into the baseband unit, and exists as a subunit of the baseband unit), or may be completed after the baseband unit generates the corresponding baseband signal and before the frequency conversion processing is performed on the baseband signal. Details are not described herein.

Figure 6:
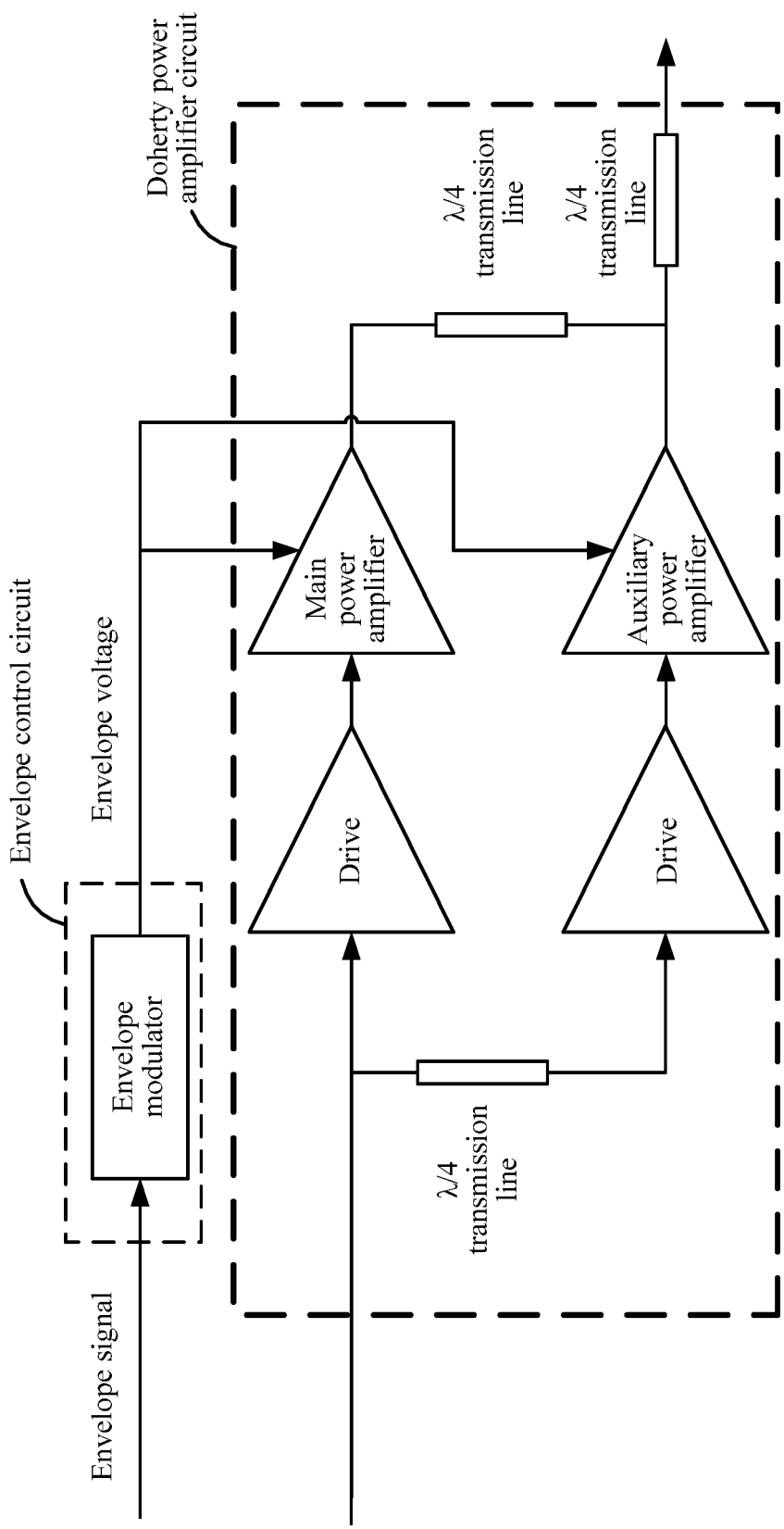
FIG. 6 is a first schematic structural diagram of a power amplifier system according to Embodiment 1 of the present disclosure.
Figure 7:
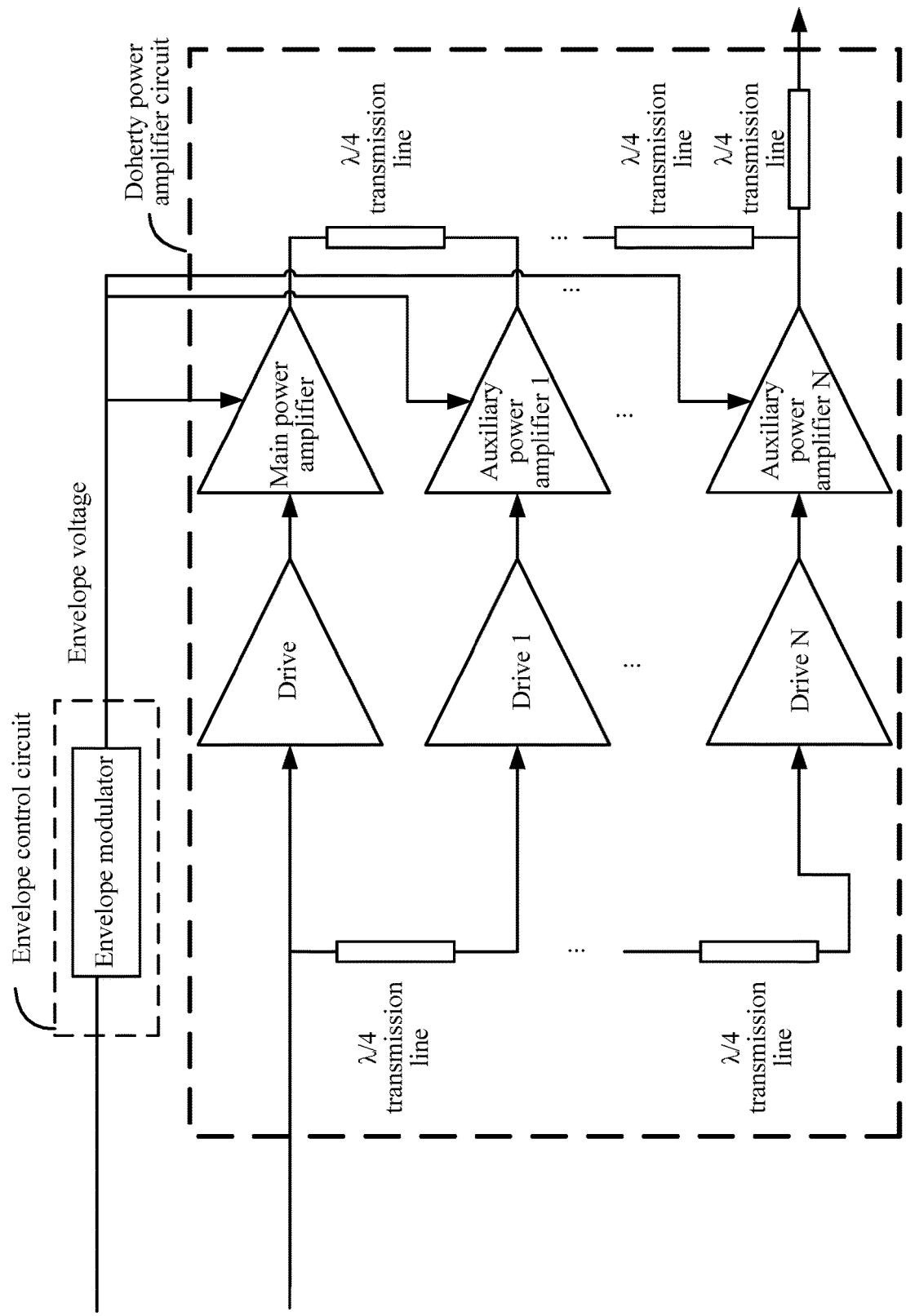
FIG. 7 is a second schematic structural diagram of a power amplifier system according to Embodiment 1 of the present disclosure.

Further, there is one (as shown in FIG. 6) or more (as shown in FIG. 7) auxiliary power amplifiers in the Doherty power amplifier circuit; and if there are a plurality of auxiliary power amplifiers in the Doherty power amplifier circuit, the performing phase modulation on a signal of an auxiliary power amplifier link in the Doherty power amplifier circuit includes:

performing phase modulation on a signal of each auxiliary power amplifier link in the Doherty power amplifier circuit.

For example, it is assumed that the Doherty power amplifier circuit includes one main power amplifier and N (a value of N is a positive integer greater than 1) auxiliary power amplifiers; if phase modulation needs to be performed on both a signal of a main power amplifier link in the Doherty power amplifier circuit and signals of auxiliary power amplifier links in the Doherty power amplifier circuit, the phase modulation is performed on the signal of the main power amplifier link, and the phase modulation is performed on a signal of each auxiliary power amplifier link, so that after the phase modulation, a phase difference between the signal of the main power amplifier link and the signal of each auxiliary power amplifier link is a specified value corresponding to the current value of the envelope signal. Details are not described herein.

It should be noted that, more auxiliary power amplifiers in the Doherty power amplifier circuit indicate higher output power of the Doherty power amplifier circuit. Therefore, in an actual application, a Doherty power amplifier circuit (that is, a multilevel Doherty power amplifier circuit) having a plurality of auxiliary power amplifiers may be used according to an actual requirement to meet a high requirement on power. This is not described in detail in this embodiment of the present disclosure.

Figure 8:
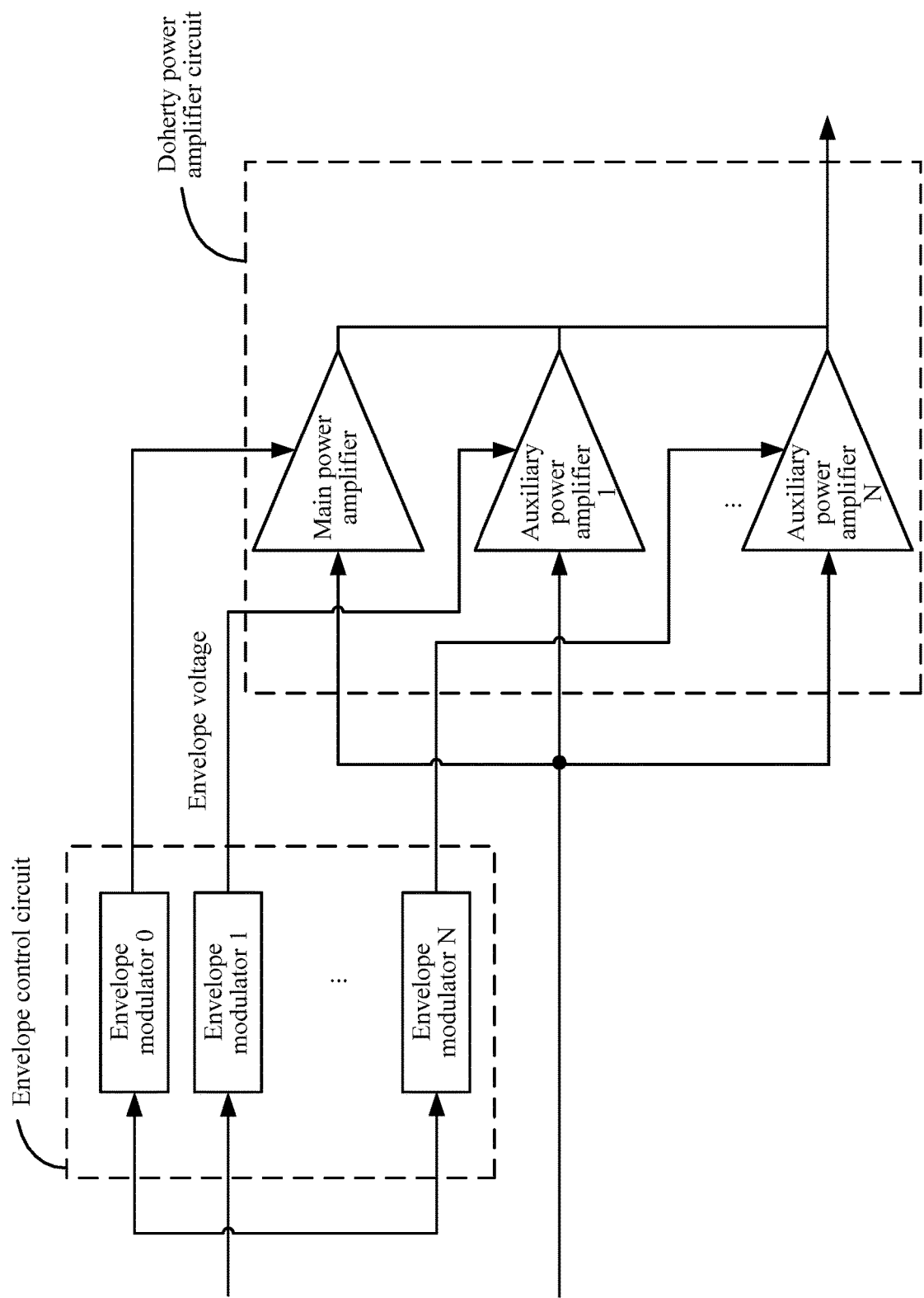
FIG. 8 is a third schematic structural diagram of a power amplifier system according to Embodiment 1 of the present disclosure.

Further, there is one or more envelope modulators in the envelope control circuit; when there is one envelope modulator in the envelope control circuit, the envelope modulator may be separately connected to power amplifiers in the Doherty power amplifier circuit, to output an envelope voltage to the power amplifiers in the Doherty power amplifier circuit; details may be shown in FIG. 6 and FIG. 7; or when there are a plurality of envelope modulators in the envelope control circuit, for example, when the envelope control circuit includes a plurality of envelope modulators connected to the power amplifiers in the Doherty power amplifier circuit in a one-to-one corresponding manner, each of the plurality of envelope modulators may be configured to output an envelope voltage to a corresponding power amplifier in the Doherty power amplifier circuit; detail may be shown in FIG. 8.

It should be noted that, when there are a plurality of envelope modulators in the envelope control circuit, each of the plurality of envelope modulators may correspond to a unique power amplifier, and may further correspond to a plurality of power amplifiers. Details are not described herein.

In addition, it should be noted that, as shown in FIG. 6 or FIG. 7, the Doherty power amplifier circuit in this embodiment of the present disclosure may include a main power amplifier and an auxiliary power amplifier, and may further include a drive power amplifier configured to provide a drive signal to power amplifiers, and a related device such as a quarter-wave transmission line. Details are not described herein.

Further, the phase modulation is digital phase modulation or analog phase modulation.

Specifically, the digital phase modulation may include QPSK (quadrature phase shift keying), or the like, and the analog phase modulation may include loop parameter phase shift, RC network phase shift, variable delay method phase modulation, and the like. This is not described in detail herein again.

That is, a phase modulation manner may be flexibly selected according to an actual requirement, to further improve flexibility of power amplifier control.

Embodiment 1 of the present disclosure provides the power amplifier control method, applicable to the power amplifier system that includes the envelope control circuit and the Doherty power amplifier circuit. The phase modulation control signal may be generated according to the envelope signal that is output by the baseband unit; and the phase modulation may be performed on the signal of the main power amplifier link and/or the auxiliary power amplifier link in the Doherty power amplifier circuit according to the phase modulation control signal, so that the phase difference between the signal of the main power amplifier link and the signal of the auxiliary power amplifier link after the phase modulation is the specified value corresponding to the current value of the envelope signal, where the specified value is the optimal phase value of the Doherty power amplifier circuit when the supply voltage of the Doherty power amplifier circuit is the envelope voltage corresponding to the current value of the envelope signal. That is, phase compensation may be performed, for different envelope voltages, on the main power amplifier link and/or the auxiliary power amplifier link, so that at the different envelope voltages, the phase difference between the main power amplifier link and the auxiliary power amplifier link can each reach an optimal value. Therefore, on a basis that an advantage of back-off efficiency of the Doherty power amplifier is fully used and saturation power of a power amplifier is increased by using an ET function, performance of the power amplifier can be further improved by adjusting phases at different voltages, thereby resolving problems such as a relatively poor effect and poor performance that exist in an existing high-efficiency power amplifier technology.

Embodiment 2

Figure 9:
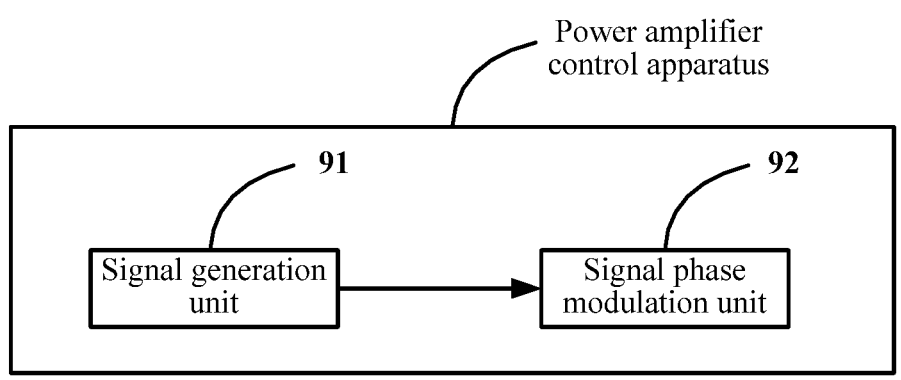
FIG. 9 is a schematic structural diagram of a power amplifier control apparatus according to Embodiment 2 of the present disclosure.

Based on a same disclosure idea in Embodiment 1 of the present disclosure, Embodiment 2 of the present disclosure provides a power amplifier control apparatus, applicable to a power amplifier system that includes an envelope control circuit and a Doherty power amplifier circuit. The envelope control circuit includes an envelope modulator configured to: generate an envelope voltage according to an envelope signal that is output by a baseband unit, and output the envelope voltage to the Doherty power amplifier circuit as a supply voltage. The Doherty power amplifier circuit includes a main power amplifier and an auxiliary power amplifier. The main power amplifier and the auxiliary power amplifier are separately configured to perform, according to the envelope voltage that is output by the envelope modulator, amplification processing on a baseband signal that is output by the baseband unit. Specifically, as shown in FIG. 9, the apparatus may include:

a signal generation unit 91 that may be configured to generate a phase modulation control signal according to the envelope signal that is output by the baseband unit; and a signal phase modulation unit 92 that may be configured to perform phase modulation on a signal of a main power amplifier link and/or an auxiliary power amplifier link in the Doherty power amplifier circuit according to the phase modulation control signal generated by the signal generation unit 91, so that a phase difference between the signal of the main power amplifier link and the signal of the auxiliary power amplifier link after the phase modulation is a specified value corresponding to a current value of the envelope signal, where the specified value is an optimal phase value of the Doherty power amplifier circuit when the supply voltage of the Doherty power amplifier circuit is the envelope voltage corresponding to the current value of the envelope signal.

That is, the signal generation unit 91 may generate a phase modulation control signal, and output the phase modulation control signal to the signal phase modulation unit 92, so as to perform the phase modulation on the signal of the main power amplifier link and/or the auxiliary power amplifier link in the Doherty power amplifier circuit, so that the phase difference between the signal of the main power amplifier link in the Doherty power amplifier circuit and the signal of the auxiliary power amplifier link in the Doherty power amplifier circuit reaches an optimal phase of the Doherty power amplifier circuit at an envelope voltage value corresponding to the current envelope signal. That is, phase compensation may be performed, for different envelope voltages, on the main power amplifier link and/or the auxiliary power amplifier link, so that at the different envelope voltages, the phase difference between the main power amplifier link and the auxiliary power amplifier link can each reach a corresponding optimal value, thereby improving an effect and performance of a power amplifier, and resolving problems such as a relatively poor effect and poor performance that exist in an existing high-efficiency power amplifier technology.

Optionally, the signal generation unit 91 is specifically configured to: if it is determined that the current value of the envelope signal is not greater than a specified envelope opening threshold, generate a first phase modulation control signal according to the envelope signal, where the first phase modulation control signal can enable the phase difference between the signal of the main power amplifier link and the signal of the auxiliary power amplifier link after the phase modulation to be a first phase value; and the first phase value is an optimal phase value of the Doherty power amplifier circuit when the supply voltage of the Doherty power amplifier circuit is a minimum envelope voltage; or if it is determined that the current value of the envelope signal is a specified envelope signal maximum value, generate a second phase modulation control signal according to the envelope signal, where the second phase modulation control signal can enable the phase difference between the signal of the main power amplifier link and the signal of the auxiliary power amplifier link after the phase modulation to be a second phase value; the second phase value is an optimal phase value of the Doherty power amplifier circuit when the supply voltage of the Doherty power amplifier circuit is a maximum envelope voltage; and the specified envelope signal maximum value is greater than the specified envelope opening threshold; or if it is determined that the current value of the envelope signal is greater than a specified envelope opening threshold and less than a specified envelope signal maximum value, generate a third phase modulation control signal according to the envelope signal, where the third phase modulation control signal can enable the phase difference between the signal of the main power amplifier link and the signal of the auxiliary power amplifier link after the phase modulation to be a third phase value; and the third phase value is obtained by performing a linear interpolation operation according to the current value of the envelope signal, a first phase value, a second phase value, an envelope opening threshold corresponding to the first phase value, and an envelope signal maximum value corresponding to the second phase value. That is, when the envelope signal changes between the specified envelope opening threshold and the specified envelope signal maximum value, the signal generation unit 91 may generate a phase modulation control signal that enables the phase difference between the signal of the main power amplifier link and the signal of the auxiliary power amplifier link to linearly change according to the envelope signal.

It should be noted that, the first phase value is the optimal phase value of the Doherty power amplifier circuit when the envelope voltage is minimum, because when the current value of the envelope signal is not greater than the specified envelope opening threshold (the threshold may be flexibly adjusted according to an actual status), the power amplifier system operates in a pure Doherty state, and the envelope modulator outputs a fixed voltage VDDL (that is, the minimum envelope voltage) to the drains of power amplifiers in the Doherty power amplifier circuit.

Similarly, the second phase value is the optimal phase value of the Doherty power amplifier circuit when the envelope voltage is maximum, because when the envelope signal is greater than the specified envelope opening threshold, the power amplifier system operates in a common state of Doherty and ET, an output voltage of the envelope modulator changes according to an envelope of the envelope signal. When the envelope signal reaches a maximum value, that is, reaches the specified envelope signal maximum value, and the envelope modulator outputs a maximum output voltage VDDH (that is, the maximum envelope voltage) to the drains of power amplifiers in the Doherty power amplifier circuit. Details are not described herein.

Optionally, the signal phase modulation unit 92 is specifically configured to: after performing frequency conversion processing on a baseband signal corresponding to the main power amplifier link and/or the auxiliary power amplifier link in the Doherty power amplifier circuit, perform the phase modulation on the signal of the main power amplifier link and/or the auxiliary power amplifier link in the Doherty power amplifier circuit; or before performing frequency conversion processing on a baseband signal corresponding to the main power amplifier link and/or the auxiliary power amplifier link in the Doherty power amplifier circuit, perform the phase modulation on the signal of the main power amplifier link and/or the auxiliary power amplifier link in the Doherty power amplifier circuit.

That is, for one or more signals that require phase modulation, a phase modulation operation may be performed after the frequency conversion or before the frequency conversion. This is not limited in this embodiment of the present disclosure.

Figure 10:
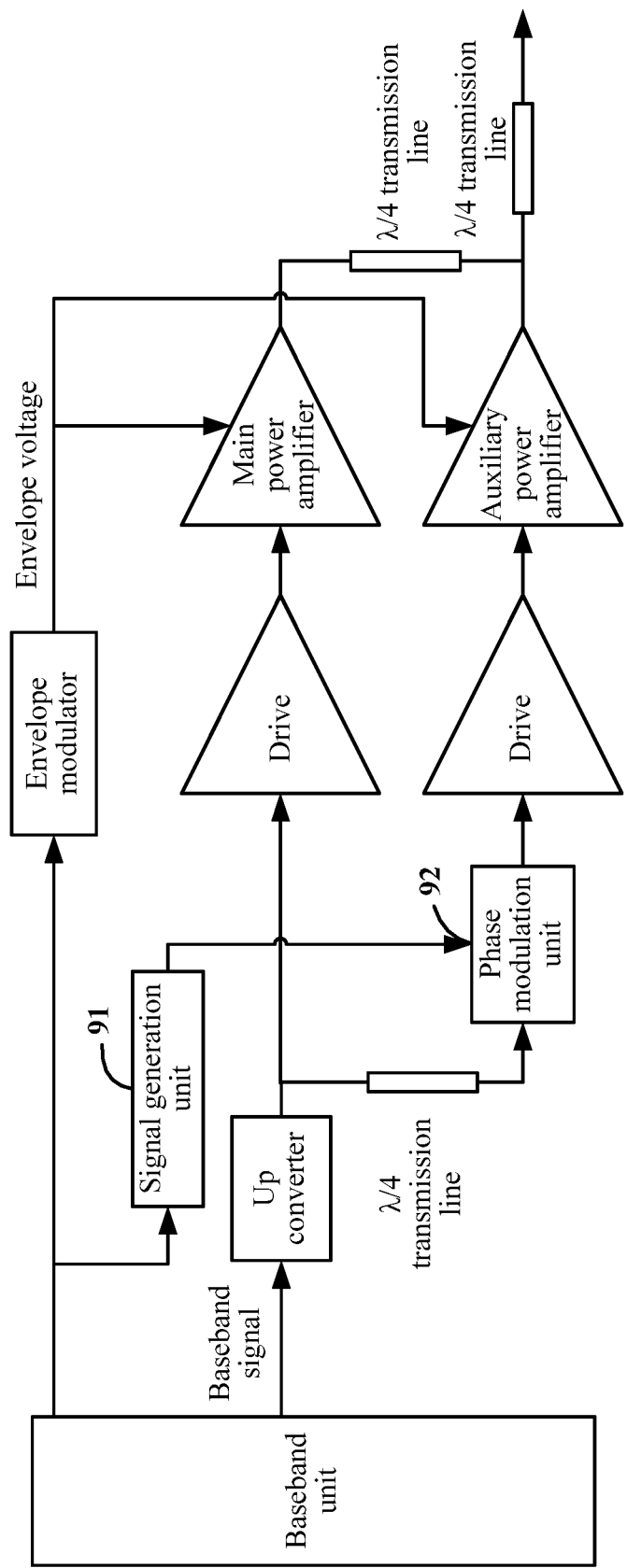
FIG. 10 is a first schematic structural diagram of power amplifier control according to Embodiment 2 of the present disclosure.
Figure 11:
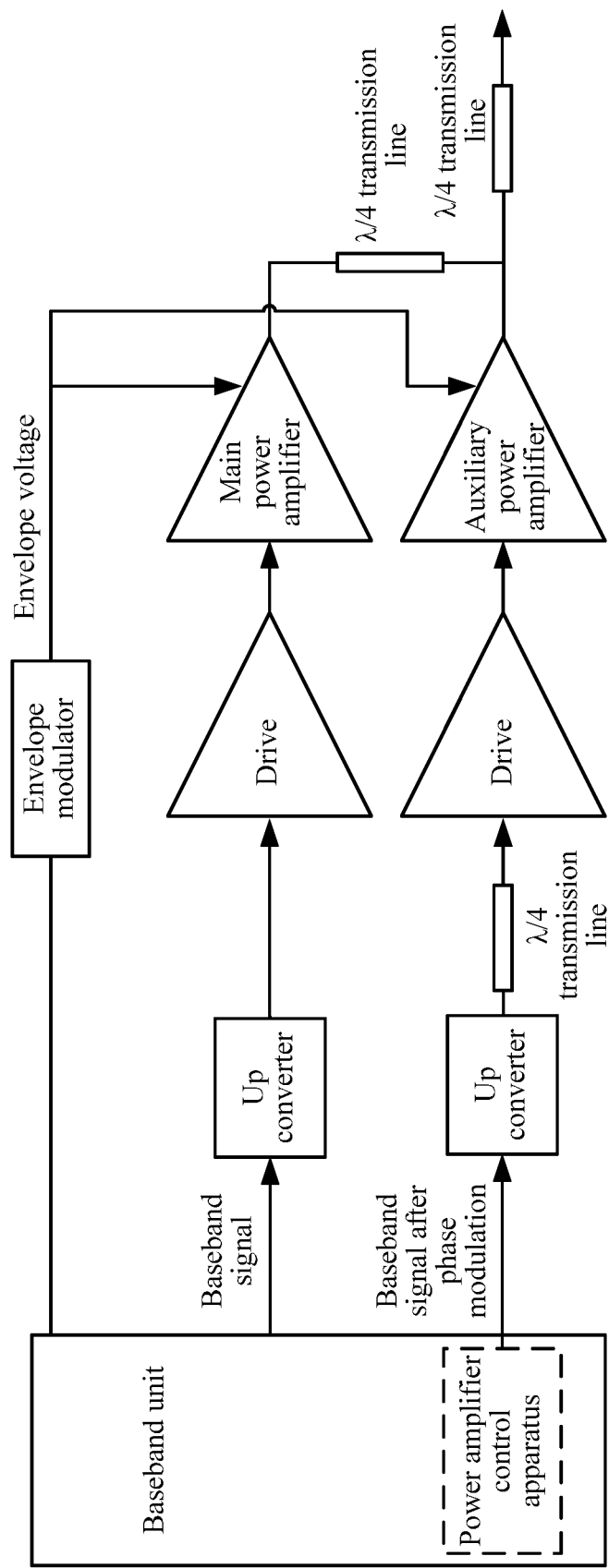
FIG. 11 is a second schematic structural diagram of power amplifier control according to Embodiment 2 of the present disclosure.

For example, as shown in FIG. 10, it is assumed that the phase modulation needs to be performed on the signal of the auxiliary power amplifier link in the Doherty power amplifier circuit, the frequency conversion processing may be performed, on an up-conversion device, on the baseband signal generated by the baseband unit, to obtain a plurality of radio frequency signals in a one-to-one correspondence to the power amplifiers in the Doherty power amplifier circuit, and then phase modulation may be performed on a radio frequency signal corresponding to the auxiliary power amplifier link, in this case, to simplify a system structure, and reduce a quantity of up-conversion devices, the baseband unit may output only one baseband signal to the power amplifier system, or certainly may output a plurality of baseband signals in a one-to-one correspondence to the power amplifiers in the Doherty power amplifier circuit, and this is not limited herein; or as shown in FIG. 11, before the frequency conversion processing is performed, on an up-conversion device, on the baseband signal generated by the baseband unit, phase modulation may be performed on the baseband signal that is generated by the baseband unit and that needs to be input to the auxiliary power amplifier link in the Doherty power amplifier circuit; in this case, the baseband unit may output a plurality of baseband signals in a one-to-one correspondence to the power amplifiers in the Doherty power amplifier circuit, or may output only two baseband signals, where one baseband signal corresponds to the main power amplifier link and the other baseband signal corresponds to all auxiliary power amplifier links; in addition, it should be noted that, phase modulation on a baseband signal corresponding to the auxiliary power amplifier link may be completed in a process of generating, by the baseband unit, the corresponding baseband signal (that is, in this case, the power amplifier control apparatus may be equivalent to being integrated into the baseband unit, and exists as a subunit of the baseband unit), or may be completed after the baseband unit generates the corresponding baseband signal and before the frequency conversion processing is performed on the baseband signal. Details are not described herein.

Further, there is one or more auxiliary power amplifiers in the Doherty power amplifier circuit; and the signal phase modulation unit 92 is specifically configured to: when there are a plurality of auxiliary power amplifiers in the Doherty power amplifier circuit, and phase modulation needs to be performed on signals of the auxiliary power amplifier links in the Doherty power amplifier circuit, perform phase modulation on a signal of each auxiliary power amplifier link in the Doherty power amplifier circuit.

For example, it is assumed that the Doherty power amplifier circuit includes one main power amplifier and N (a value of N is a positive integer greater than 1) auxiliary power amplifiers; if phase modulation needs to be performed on both a signal of a main power amplifier link in the Doherty power amplifier circuit and signals of auxiliary power amplifier links in the Doherty power amplifier circuit, the phase modulation is performed on the signal of the main power amplifier link, and the phase modulation is performed on a signal of each auxiliary power amplifier link, so that after the phase modulation, a phase difference between the signal of the main power amplifier link and the signal of each auxiliary power amplifier link is a specified value corresponding to the current value of the envelope signal. Details are not described herein.

It should be noted that, more auxiliary power amplifiers in the Doherty power amplifier circuit indicate higher output power of the Doherty power amplifier circuit. Therefore, in an actual application, a Doherty power amplifier circuit (that is, a multilevel Doherty power amplifier circuit) having a plurality of auxiliary power amplifiers may be used according to an actual requirement to meet a high requirement on power. This is not described in detail in this embodiment of the present disclosure.

Further, it should be noted that, the signal generation unit 91 may include one or more small signal modulators; and the signal phase modulation unit 92 may include one or more phase modulation circuits.

Figure 12:
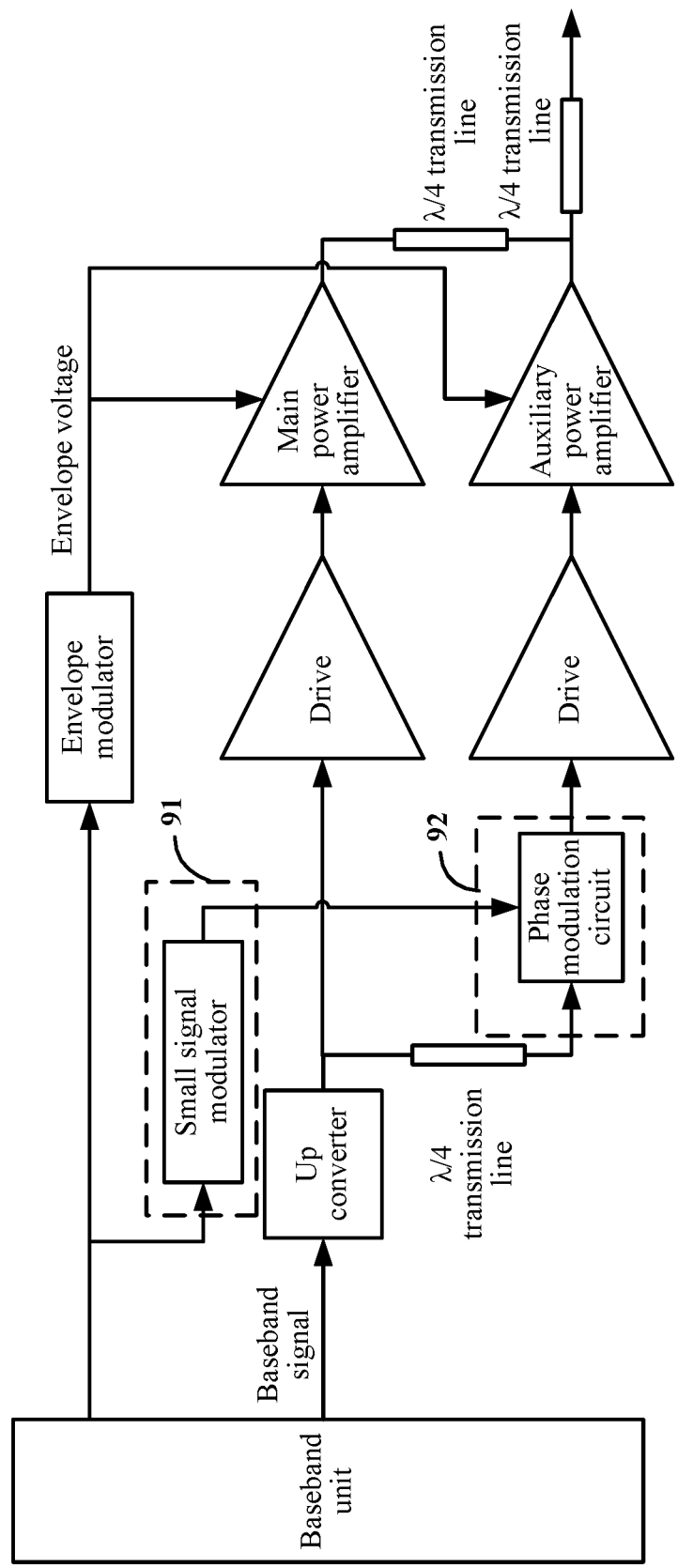
FIG. 12 is a third schematic structural diagram of power amplifier control according to Embodiment 2 of the present disclosure.
Figure 13:
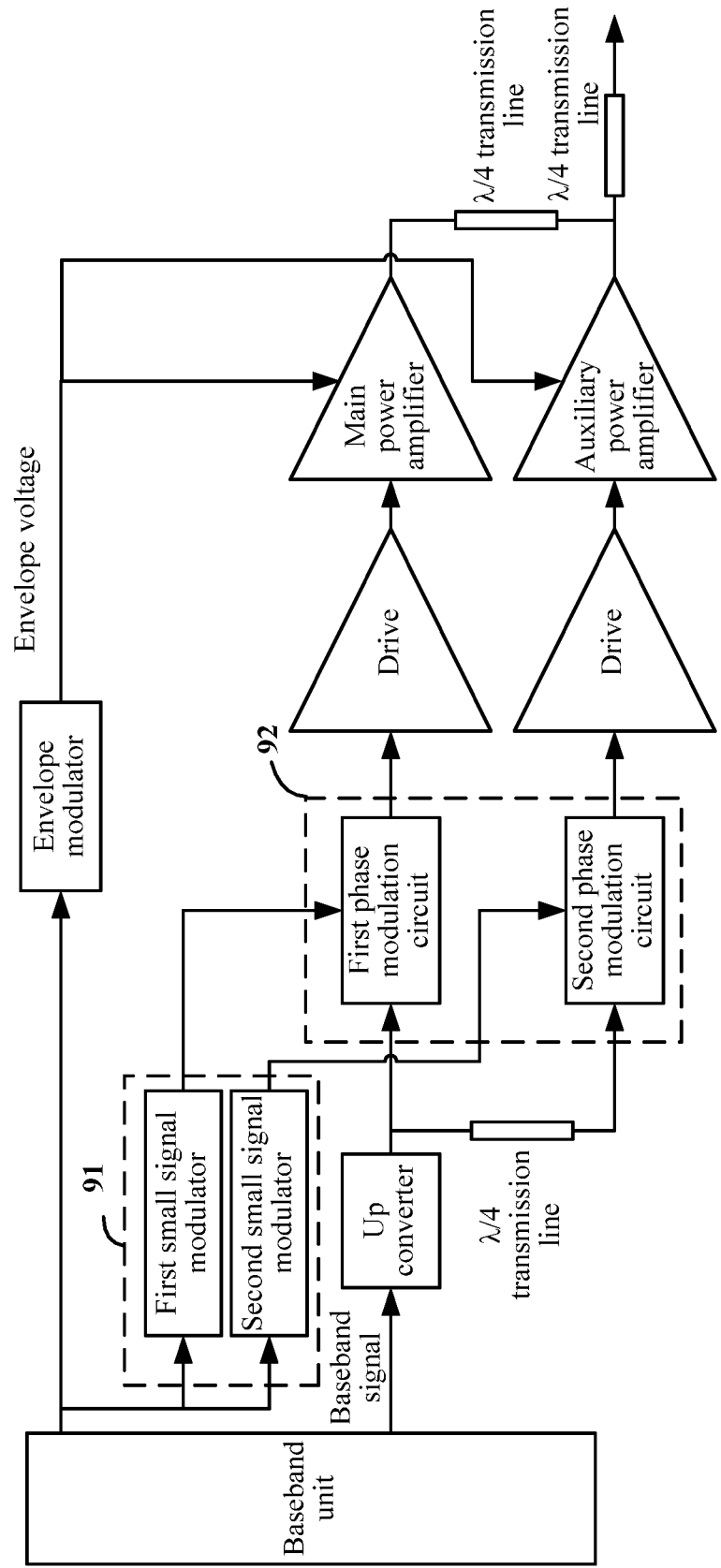
FIG. 13 is a fourth schematic structural diagram of power amplifier control according to Embodiment 2 of the present disclosure.

For example, when phase modulation needs to be performed only on a signal of a main power amplifier link, or when phase modulation needs to be performed only on a signal of an auxiliary power amplifier link, as shown in FIG. 12 (using an example in which a power amplifier link that requires phase modulation is an auxiliary power amplifier link), the signal generation unit 91 may include one small signal modulator, and the signal phase modulation unit 92 may include one phase modulation circuit corresponding to the small signal modulator; the small signal modulator is configured to: generate a phase modulation control signal according to an envelope signal generated by the baseband unit, and output the phase modulation control signal to the phase modulation circuit; and the phase modulation circuit is configured to adjust a phase of a corresponding power amplifier link to a specified phase according to the phase modulation control signal that is output by the small signal modulator; or when phase modulation needs to be performed on both a signal of a main power amplifier link and a signal of an auxiliary power amplifier link, as shown in FIG. 13, the signal generation unit 91 may include one first small signal modulator configured to generate a first sub-phase modulation control signal corresponding to the main power amplifier link, and one second small signal modulator configured to generate a second sub-phase modulation control signal corresponding to the auxiliary power amplifier link; and the signal phase modulation unit 92 may include a first phase modulation circuit that corresponds to the first small signal modulator and that is configured to adjust a phase of a signal corresponding to the main power amplifier link to a first sub-phase, and a second phase modulation circuit that corresponds to the second small signal modulator and that is configured to adjust a phase of a signal corresponding to the auxiliary power amplifier link to a second sub-phase, where a phase difference between the first sub-phase and the second sub-phase is a specified value.

Figure 14:
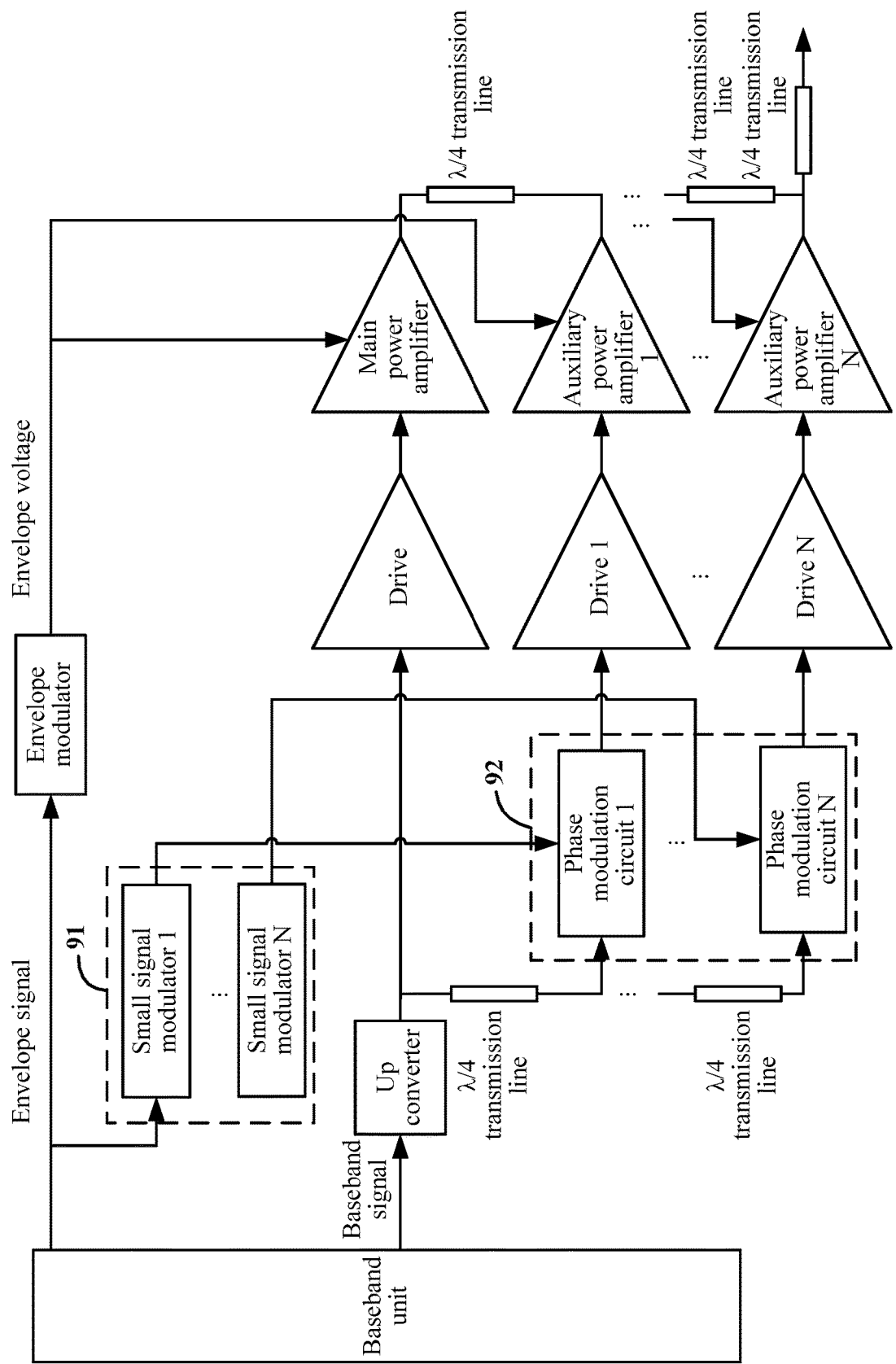
FIG. 14 is a fifth schematic structural diagram of power amplifier control according to Embodiment 2 of the present disclosure.

It should be noted that, when there are a plurality of auxiliary power amplifiers, and phase modulation needs to be performed on the auxiliary power amplifier links, as shown in FIG. 14 (using an example in which phase modulation is performed on signals of the auxiliary power amplifier links), the signal generation unit 91 may include a plurality of small signal modulators (for example, a small signal modulator 1 to a small signal modulator N shown in FIG. 14) that each are in a one-to-one correspondence to the plurality of auxiliary power amplifiers, and the signal phase modulation unit 92 may include a plurality of phase modulation circuits (for example, a phase modulation circuit 1 to a phase modulation circuit N shown in FIG. 14) that each are in a one-to-one correspondence to the plurality of auxiliary power amplifiers. Details are not described herein.

That is, both a quantity of small signal modulators in the signal generation unit 91 and a quantity of phase modulation circuits in the signal phase modulation unit 92 may be flexibly set according to an actual status, as long as it can be ensured that a phase difference between a signal of a main power amplifier link in the Doherty power amplifier circuit and a signal of an auxiliary power amplifier link in the Doherty power amplifier circuit is a specified value. This is not described in detail.

Further, there is one or more envelope modulators in the envelope control circuit; when there is one envelope modulator in the envelope control circuit, the envelope modulator may be separately connected to power amplifiers in the Doherty power amplifier circuit, to output an envelope voltage to the power amplifiers in the Doherty power amplifier circuit; details may be shown in FIG. 7; or when there are a plurality of envelope modulators in the envelope control circuit, for example, when the envelope control circuit includes a plurality of envelope modulators connected to the power amplifiers in the Doherty power amplifier circuit in a one-to-one corresponding manner, each of the plurality of envelope modulators may be configured to output an envelope voltage to a corresponding power amplifier in the Doherty power amplifier circuit; detail may be shown in FIG. 8.

In addition, it should be noted that, when there are a plurality of envelope modulators in the envelope control circuit, each of the plurality of envelope modulators may correspond to a unique power amplifier, and may further correspond to a plurality of power amplifiers. Details are not described herein.

Further, the phase modulation is digital phase modulation or analog phase modulation.

Specifically, the digital phase modulation may include QPSK (quadrature phase shift keying), or the like, and the analog phase modulation may include loop parameter phase shift, RC network phase shift, variable delay method phase modulation, and the like. This is not described in detail herein again.

That is, a modulation manner may be flexibly selected according to an actual requirement, to further improve flexibility of power amplifier control.

In addition, it should be noted that, generally the power amplifier control apparatus in this embodiment of the present disclosure may exist independently of a device such as the baseband unit. Certainly, besides that the power amplifier control apparatus may exist independently of the device such as the baseband unit, the power amplifier control apparatus may be further integrated into the baseband unit and exist as a subunit of the baseband unit, as shown in FIG. 11. This is not described in detail.

Embodiment 3

Figure 15:
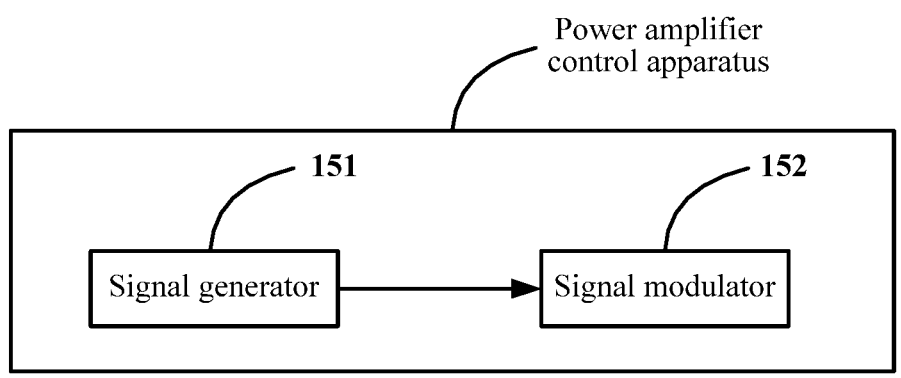
FIG. 15 is a schematic structural diagram of a power amplifier control apparatus according to Embodiment 3 of the present disclosure.

Based on the same disclosure idea of Embodiment 1 and Embodiment 2 of the present disclosure, Embodiment 3 of the present disclosure further provides another power amplifier control apparatus, applicable to a power amplifier system that includes an envelope control circuit and a Doherty power amplifier circuit. The envelope control circuit includes an envelope modulator configured to: generate an envelope voltage according to an envelope signal that is output by a baseband unit, and output the envelope voltage to the Doherty power amplifier circuit as a supply voltage. The Doherty power amplifier circuit includes a main power amplifier and an auxiliary power amplifier. The main power amplifier and the auxiliary power amplifier are separately configured to perform, according to the envelope voltage that is output by the envelope modulator, amplification processing on a baseband signal that is output by the baseband unit. Specifically, as shown in FIG. 15, the apparatus may include:

a signal generator 151 that may be configured to generate a phase modulation control signal according to the envelope signal that is output by the baseband unit; and a signal modulator 152 that may be configured to perform phase modulation on a signal of a main power amplifier link and/or an auxiliary power amplifier link in the Doherty power amplifier circuit according to the phase modulation control signal generated by the signal generator 151, so that a phase difference between the signal of the main power amplifier link and the signal of the auxiliary power amplifier link after the phase modulation is a specified value corresponding to a current value of the envelope signal, where the specified value is an optimal phase value of the Doherty power amplifier circuit when the supply voltage of the Doherty power amplifier circuit is the envelope voltage corresponding to the current value of the envelope signal.

That is, the signal generator 151 may generate a phase modulation control signal, and output the phase modulation control signal to the signal modulator 152, so as to perform the phase modulation on the signal of the main power amplifier link and/or the auxiliary power amplifier link in the Doherty power amplifier circuit, so that the phase difference between the signal of the main power amplifier link in the Doherty power amplifier circuit and the signal of the auxiliary power amplifier link in the Doherty power amplifier circuit reaches an optimal phase of the Doherty power amplifier circuit at an envelope voltage value corresponding to the current envelope signal. That is, phase compensation may be performed, for different envelope voltages, on the main power amplifier link and/or the auxiliary power amplifier link, so that at the different envelope voltages, the phase difference between the main power amplifier link and the auxiliary power amplifier link can each reach a corresponding optimal value, thereby improving an effect and performance of a power amplifier, and resolving problems such as a relatively poor effect and poor performance that exist in an existing high-efficiency power amplifier technology.

Optionally, the signal generator 151 is specifically configured to: if it is determined that the current value of the envelope signal is not greater than a specified envelope opening threshold, generate a first phase modulation control signal according to the envelope signal, where the first phase modulation control signal can enable the phase difference between the signal of the main power amplifier link and the signal of the auxiliary power amplifier link after the phase modulation to be a first phase value; and the first phase value is an optimal phase value of the Doherty power amplifier circuit when the supply voltage of the Doherty power amplifier circuit is a minimum envelope voltage; or if it is determined that the current value of the envelope signal is a specified envelope signal maximum value, generate a second phase modulation control signal according to the envelope signal, where the second phase modulation control signal can enable the phase difference between the signal of the main power amplifier link and the signal of the auxiliary power amplifier link after the phase modulation to be a second phase value; the second phase value is an optimal phase value of the Doherty power amplifier circuit when the supply voltage of the Doherty power amplifier circuit is a maximum envelope voltage; and the specified envelope signal maximum value is greater than the specified envelope opening threshold; or if it is determined that the current value of the envelope signal is greater than a specified envelope opening threshold and less than a specified envelope signal maximum value, generate a third phase modulation control signal according to the envelope signal, where the third phase modulation control signal can enable the phase difference between the signal of the main power amplifier link and the signal of the auxiliary power amplifier link after the phase modulation to be a third phase value; and the third phase value is obtained by performing a linear interpolation operation according to the current value of the envelope signal, a first phase value, a second phase value, an envelope opening threshold corresponding to the first phase value, and an envelope signal maximum value corresponding to the second phase value. That is, when the envelope signal changes between the specified envelope opening threshold and the specified envelope signal maximum value, the signal generator 151 may generate a phase modulation control signal that enables the phase difference between the signal of the main power amplifier link and the signal of the auxiliary power amplifier link to linearly change according to the envelope signal.

It should be noted that, the first phase value is the optimal phase value of the Doherty power amplifier circuit when the envelope voltage is minimum, because when the current value of the envelope signal is not greater than the specified envelope opening threshold (the threshold may be flexibly adjusted according to an actual status), the power amplifier system operates in a pure Doherty state, and the envelope modulator outputs a fixed voltage VDDL (that is, the minimum envelope voltage) to the drains of power amplifiers in the Doherty power amplifier circuit.

Similarly, the second phase value is the optimal phase value of the Doherty power amplifier circuit when the envelope voltage is maximum, because when the envelope signal is greater than the specified envelope opening threshold, the power amplifier system operates in a common state of Doherty and ET, an output voltage of the envelope modulator changes according to an envelope of the envelope signal. When the envelope signal reaches a maximum value, that is, reaches the specified envelope signal maximum value, and the envelope modulator outputs a maximum output voltage VDDH (that is, the maximum envelope voltage) to the drains of power amplifiers in the Doherty power amplifier circuit. Details are not described herein.

Optionally, the signal modulator 152 is specifically configured to: after performing frequency conversion processing on a baseband signal corresponding to the main power amplifier link and/or the auxiliary power amplifier link in the Doherty power amplifier circuit, perform the phase modulation on the signal of the main power amplifier link and/or the auxiliary power amplifier link in the Doherty power amplifier circuit; or before performing frequency conversion processing on a baseband signal corresponding to the main power amplifier link and/or the auxiliary power amplifier link in the Doherty power amplifier circuit, perform the phase modulation on the signal of the main power amplifier link and/or the auxiliary power amplifier link in the Doherty power amplifier circuit.

That is, for one or more signals that require phase modulation, a phase modulation operation may be performed after the frequency conversion or before the frequency conversion. This is not limited in this embodiment of the present disclosure.

For example, it is assumed that the phase modulation needs to be performed on the signal of the auxiliary power amplifier link in the Doherty power amplifier circuit, the frequency conversion processing may be performed, on an up-conversion device, on the baseband signal generated by the baseband unit, to obtain a plurality of radio frequency signals in a one-to-one correspondence to the power amplifiers in the Doherty power amplifier circuit, and then phase modulation may be performed on a radio frequency signal corresponding to the auxiliary power amplifier link; in this case, to simplify a system structure, and reduce a quantity of up-conversion devices, the baseband unit may output only one baseband signal to the power amplifier system, or certainly may output a plurality of baseband signals in a one-to-one correspondence to the power amplifiers in the Doherty power amplifier circuit, and this is not limited herein; or before the frequency conversion processing is performed, on an up-conversion device, on the baseband signal generated by the baseband unit, phase modulation may be performed on the baseband signal that is generated by the baseband unit and that needs to be input to the auxiliary power amplifier link in the Doherty power amplifier circuit; in this case, the baseband unit may output a plurality of baseband signals in a one-to-one correspondence to the power amplifiers in the Doherty power amplifier circuit, or may output only two baseband signals, where one baseband signal corresponds to the main power amplifier link and the other baseband signal corresponds to all auxiliary power amplifier links; in addition, it should be noted that, phase modulation on a baseband signal corresponding to the auxiliary power amplifier link may be completed in a process of generating, by the baseband unit, the corresponding baseband signal (that is, in this case, the power amplifier control apparatus may be equivalent to being integrated into the baseband unit, and exists as a subunit of the baseband unit), or may be completed after the baseband unit generates the corresponding baseband signal and before the frequency conversion processing is performed on the baseband signal. Details are not described herein.

Further, there is one or more auxiliary power amplifiers in the Doherty power amplifier circuit; and the signal modulator 152 is specifically configured to: when there are a plurality of auxiliary power amplifiers in the Doherty power amplifier circuit, and phase modulation needs to be performed on signals of the auxiliary power amplifier links in the Doherty power amplifier circuit, perform phase modulation on a signal of each auxiliary power amplifier link in the Doherty power amplifier circuit.

For example, it is assumed that the Doherty power amplifier circuit includes one main power amplifier and N (a value of N is a positive integer greater than 1) auxiliary power amplifiers; if phase modulation needs to be performed on both a signal of a main power amplifier link in the Doherty power amplifier circuit and signals of auxiliary power amplifier links in the Doherty power amplifier circuit, the phase modulation is performed on the signal of the main power amplifier link, and the phase modulation is performed on a signal of each auxiliary power amplifier link, so that after the phase modulation, a phase difference between the signal of the main power amplifier link and the signal of each auxiliary power amplifier link is a specified value corresponding to the current value of the envelope signal. Details are not described herein.

It should be noted that, more auxiliary power amplifiers in the Doherty power amplifier circuit indicate higher output power of the Doherty power amplifier circuit. Therefore, in an actual application, a Doherty power amplifier circuit (that is, a multilevel Doherty power amplifier circuit) having a plurality of auxiliary power amplifiers may be used according to an actual requirement to meet a high requirement on power. This is not described in detail in this embodiment of the present disclosure.

Further, it should be noted that, the signal generator 151 may include one or more small signal modulators; and the signal modulator 152 may include one or more phase modulation circuits.

For example, when phase modulation needs to be performed only on a signal of a main power amplifier link, or when phase modulation needs to be performed only on a signal of an auxiliary power amplifier link, the signal generator 151 may include one small signal modulator, and the signal modulator 152 may include one phase modulation circuit corresponding to the small signal modulator; the small signal modulator is configured to: generate a phase modulation control signal according to an envelope signal generated by the baseband unit, and output the phase modulation control signal to the phase modulation circuit; and the phase modulation circuit is configured to adjust a phase of a corresponding power amplifier link to a specified phase according to the phase modulation control signal that is output by the small signal modulator; or when phase modulation needs to be performed on both a signal of a main power amplifier link and a signal of an auxiliary power amplifier link, the signal generator 151 may include one first small signal modulator configured to generate a first sub-phase modulation control signal corresponding to the main power amplifier link, and one second small signal modulator configured to generate a second sub-phase modulation control signal corresponding to the auxiliary power amplifier link; and the signal modulator 152 may include a first phase modulation circuit that corresponds to the first small signal modulator and that is configured to adjust a phase of a signal corresponding to the main power amplifier link to a first sub-phase, and a second phase modulation circuit that corresponds to the second small signal modulator and that is configured to adjust a phase of a signal corresponding to the auxiliary power amplifier link to a second sub-phase, where a phase difference between the first sub-phase and the second sub-phase is a specified value.

It should be noted that, when there are a plurality of auxiliary power amplifiers, and phase modulation needs to be performed on the auxiliary power amplifier links, the signal generator 151 may include a plurality of small signal modulators that each are in a one-to-one correspondence to the plurality of auxiliary power amplifiers, and the signal modulator 152 may include a plurality of phase modulation circuits that each are in a one-to-one correspondence to the plurality of auxiliary power amplifiers. Details are not described herein.

That is, both a quantity of small signal modulators in the signal generator 151 and a quantity of phase modulation circuits in the signal modulator 152 may be flexibly set according to an actual status, as long as it can be ensured that a phase difference between a signal of a main power amplifier link in the Doherty power amplifier circuit and a signal of an auxiliary power amplifier link in the Doherty power amplifier circuit is a specified value. This is not described in detail.

Further, there is one or more envelope modulators in the envelope control circuit; when there is one envelope modulator in the envelope control circuit, the envelope modulator may be separately connected to power amplifiers in the Doherty power amplifier circuit, to output an envelope voltage to the power amplifiers in the Doherty power amplifier circuit; details may be shown in FIG. 7; or when there are a plurality of envelope modulators in the envelope control circuit, for example, when the envelope control circuit includes a plurality of envelope modulators connected to the power amplifiers in the Doherty power amplifier circuit in a one-to-one corresponding manner, each of the plurality of envelope modulators may be configured to output an envelope voltage to a corresponding power amplifier in the Doherty power amplifier circuit; detail may be shown in FIG. 8.

In addition, it should be noted that, when there are a plurality of envelope modulators in the envelope control circuit, each of the plurality of envelope modulators may correspond to a unique power amplifier, and may further correspond to a plurality of power amplifiers. Details are not described herein.

Further, the phase modulation is digital phase modulation or analog phase modulation.

Specifically, the digital phase modulation may include QPSK (Quadrature Phase Shift Keying, quadrature phase shift keying), or the like, and the analog phase modulation may include loop parameter phase shift, RC network phase shift, variable delay method phase modulation, and the like. This is not described in detail herein again.

That is, a modulation manner may be flexibly selected according to an actual requirement, to further improve flexibility of power amplifier control.

In addition, it should be noted that, generally the power amplifier control apparatus in this embodiment of the present disclosure may exist independently of a device such as the baseband unit. Certainly, besides that the power amplifier control apparatus may exist independently of the device such as the baseband unit, the power amplifier control apparatus may be further integrated into the baseband unit and exist as a subunit of the baseband unit. This is not described in detail.

Embodiment 4

Embodiment 4 of the present disclosure provides a power amplifier control system, including a power amplifier system that includes an envelope control circuit and a Doherty power amplifier circuit. The envelope control circuit includes an envelope modulator configured to: generate an envelope voltage according to an envelope signal that is output by a baseband unit, and output the envelope voltage to the Doherty power amplifier circuit as a supply voltage. The Doherty power amplifier circuit includes a main power amplifier and an auxiliary power amplifier. The main power amplifier and the auxiliary power amplifier are separately configured to perform, according to the envelope voltage that is output by the envelope modulator, amplification processing on a baseband signal that is output by the baseband unit. The power amplifier control system further includes the power amplifier control apparatus in Embodiment 2 of the present disclosure or the power amplifier control apparatus in Embodiment 3 of the present disclosure. This is not described in detail.

In addition, it should be noted that, as shown in FIG. 14, in addition to the power amplifier system that includes the envelope control circuit and the Doherty power amplifier circuit, and the power amplifier control apparatus in Embodiment 2 of the present disclosure or Embodiment 3 of the present disclosure, the power amplifier control system in this embodiment of the present disclosure may further include devices, such as the baseband unit configured to generate a baseband signal and a corresponding envelope signal, and an up converter that performs frequency conversion processing on the baseband signal.

Persons skilled in the art should understand that the embodiments of the present disclosure may be provided as a method, an apparatus (device), or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a CD-ROM, an optical memory, and the like) that include computer-usable program code.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the other programmable device provide steps for implementing a specific function in one or more processes in the flowcharts and/or in one or more blocks in the block diagrams.

Although some embodiments of the present disclosure have been described, persons skilled in the art can make changes and modifications to these embodiments once they learn the basic inventive concept. Therefore, the following claims are intended to be construed as to cover the preferred embodiments and all changes and modifications falling within the scope of the present disclosure.

Obviously, persons skilled in the art can make various modifications and variations to the present disclosure without departing from the spirit and scope of the present disclosure. The present disclosure is intended to cover these modifications and variations provided that they fall within the scope of protection defined by the following claims and their equivalent technologies.

What is claimed is:

1. A power amplifier control method for use in a power amplifier system that comprises an envelope control circuit and a Doherty power amplifier circuit, wherein the envelope control circuit comprises an envelope modulator configured to generate an envelope voltage according to an envelope signal output by a baseband unit, and output the envelope voltage to the Doherty power amplifier circuit as a supply voltage, and wherein the Doherty power amplifier circuit comprises a main power amplifier and an auxiliary power amplifier separately configured to perform, according to the envelope voltage output by the envelope modulator, amplification processing on a baseband signal output by the baseband unit, the method comprising:

generating a phase modulation control signal according to the envelope signal output by the baseband unit; and performing phase modulation on a signal of a main power amplifier link and/or an auxiliary power amplifier link in the Doherty power amplifier circuit according to the generated phase modulation control signal, such that a phase difference between the signal of the main power amplifier link and the signal of the auxiliary power amplifier link after the phase modulation is a specified value corresponding to a current value of the envelope signal, wherein the specified value is an optimal phase value of the Doherty power amplifier circuit when the supply voltage of the Doherty power amplifier circuit is the envelope voltage corresponding to the current value of the envelope signal.

2. The control method according to claim 1, wherein generating a phase modulation control signal according to the envelope signal output by the baseband unit comprises:

generating a first phase modulation control signal when the current value of the envelope signal is not greater than a specified envelope opening threshold, wherein the first phase modulation control signal is to be generated according to the envelope signal for enabling the phase difference between the signal of the main power amplifier link and the signal of the auxiliary power amplifier link after the phase modulation to be a first phase value that is an optimal phase value of the Doherty power amplifier circuit when the supply voltage of the Doherty power amplifier circuit is a minimum envelope voltage; or generating a second phase modulation control signal when the current value of the envelope signal is a specified envelope signal maximum value, wherein the second phase modulation control signal is to be generated according to the envelope signal for enabling the phase difference between the signal of the main power amplifier link and the signal of the auxiliary power amplifier link after the phase modulation to be a second phase value that is an optimal phase value of the Doherty power amplifier circuit when the supply voltage of the Doherty power amplifier circuit is a maximum envelope voltage, and wherein the specified envelope signal maximum value is greater than the specified envelope opening threshold; or generating a third phase modulation control signal when the current value of the envelope signal is greater than a specified envelope opening threshold and less than a specified envelope signal maximum value, wherein the third phase modulation control signal is to be generated according to the envelope signal for enabling the phase difference between the signal of the main power amplifier link and the signal of the auxiliary power amplifier link after the phase modulation to be a third phase value that is obtained by performing a linear interpolation operation according to the current value of the envelope signal, a first phase value, a second phase value, an envelope opening threshold corresponding to the first phase value, and an envelope signal maximum value corresponding to the second phase value.

3. The control method according to claim 1, wherein performing phase modulation on a signal of a main power amplifier link and/or an auxiliary power amplifier link in the Doherty power amplifier circuit according to the generated phase modulation control signal comprises:

performing the phase modulation on the signal of the main power amplifier link and/or the auxiliary power amplifier link in the Doherty power amplifier circuit after performing frequency conversion processing on a baseband signal corresponding to the main power amplifier link and/or the auxiliary power amplifier link in the Doherty power amplifier circuit; or performing the phase modulation on the signal of the main power amplifier link and/or the auxiliary power amplifier link in the Doherty power amplifier circuit before performing frequency conversion processing on a baseband signal corresponding to the main power amplifier link and/or the auxiliary power amplifier link in the Doherty power amplifier circuit.

4. The control method according to claim 1, wherein the Doherty power amplifier circuit comprises one or more auxiliary power amplifiers, and when the Doherty power amplifier circuit comprises two or more auxiliary power amplifiers, performing phase modulation on a signal of an auxiliary power amplifier link in the Doherty power amplifier circuit comprises performing phase modulation on a signal of each auxiliary power amplifier link in the Doherty power amplifier circuit.

5. The control method according to claim 1, wherein the envelope control circuit comprises:

one envelope modulator separately connected to power amplifiers in the Doherty power amplifier circuit, wherein the one envelope modulator is configured to output an envelope voltage to the power amplifiers in the Doherty power amplifier circuit; or a plurality of envelope modulators connected to power amplifiers in the Doherty power amplifier circuit in a one-to-one corresponding manner, wherein each of the plurality of envelope modulators is configured to output an envelope voltage to a corresponding power amplifier in the Doherty power amplifier circuit.

6. The control method according to claim 1, wherein the phase modulation is digital phase modulation or analog phase modulation.

7. A power amplifier control apparatus for use with a power amplifier system that comprises an envelope control circuit and a Doherty power amplifier circuit, wherein the envelope control circuit comprises an envelope modulator configured to generate an envelope voltage according to an envelope signal output by a baseband unit, and output the envelope voltage to the Doherty power amplifier circuit as a supply voltage, and wherein the Doherty power amplifier circuit comprises a main power amplifier and an auxiliary power amplifier that are separately configured to perform, according to the envelope voltage output by the envelope modulator, amplification processing on a baseband signal output by the baseband unit, the apparatus comprising:

a signal generation unit; configured to generate a phase modulation control signal according to the envelope signal output by the baseband unit; and a signal phase modulation unit configured to perform phase modulation on a signal of a main power amplifier link and/or an auxiliary power amplifier link in the Doherty power amplifier circuit according to the generated phase modulation control signal, such that a phase difference between the signal of the main power amplifier link and the signal of the auxiliary power amplifier link after the phase modulation is a specified value corresponding to a current value of the envelope signal, wherein the specified value is an optimal phase value of the Doherty power amplifier circuit when the supply voltage of the Doherty power amplifier circuit is the envelope voltage corresponding to the current value of the envelope signal.

8. The control apparatus according to claim 7, wherein the signal generation unit is configured to:

generate a first phase modulation control signal when the current value of the envelope signal is not greater than a specified envelope opening threshold, wherein the first phase modulation control signal is to be generated according to the envelope signal for enabling the phase difference between the signal of the main power amplifier link and the signal of the auxiliary power amplifier link after the phase modulation to be a first phase value that is an optimal phase value of the Doherty power amplifier circuit when the supply voltage of the Doherty power amplifier circuit is a minimum envelope voltage; or generate a second phase modulation control signal when the current value of the envelope signal is a specified envelope signal maximum value, wherein the second phase modulation control signal is to be generated according to the envelope signal for enabling the phase difference between the signal of the main power amplifier link and the signal of the auxiliary power amplifier link after the phase modulation to be a second phase value that is an optimal phase value of the Doherty power amplifier circuit when the supply voltage of the Doherty power amplifier circuit is a maximum envelope voltage, and wherein the specified envelope signal maximum value is greater than the specified envelope opening threshold; or generate a third phase modulation control signal when the current value of the envelope signal is greater than a specified envelope opening threshold and less than a specified envelope signal maximum value, wherein the third phase modulation control signal is to be generated according to the envelope signal for enabling the phase difference between the signal of the main power amplifier link and the signal of the auxiliary power amplifier link after the phase modulation to be a third phase value that is obtained by performing a linear interpolation operation according to the current value of the envelope signal, a first phase value, a second phase value, an envelope opening threshold corresponding to the first phase value, and an envelope signal maximum value corresponding to the second phase value.

9. The control apparatus according to claim 7, wherein the signal phase modulation unit is configured to:
perform the phase modulation on the signal of the main power amplifier link and or the auxiliary power amplifier link in the Doherty power amplifier circuit after performing frequency conversion processing on a baseband signal corresponding to the main power amplifier link and/or the auxiliary power amplifier link in the Doherty power amplifier circuit; or
perform the phase modulation on the signal of the main power amplifier link and/or the auxiliary power amplifier link in the Doherty power amplifier circuit before performing frequency conversion processing on a baseband signal corresponding to the main power amplifier link and/or the auxiliary power amplifier link in the Doherty power amplifier circuit.

10. The control apparatus according to claim 7, wherein the Doherty power amplifier comprises one or more auxiliary power amplifiers in the Doherty power amplifier circuit, and the signal phase modulation unit is configured to perform phase modulation on a signal of each auxiliary power amplifier link in the Doherty power amplifier circuit when the Doherty power amplifier circuit comprises two or more auxiliary power amplifiers.

11. The control apparatus according to claim 7, wherein the envelope control circuit comprises:
one envelope modulator separately connected to power amplifiers in the Doherty power amplifier circuit, wherein the one envelope modulator is configured to output an envelope voltage to the power amplifiers in the Doherty power amplifier circuit; or
a plurality of envelope modulators connected to power amplifiers in the Doherty power amplifier circuit in a one-to-one corresponding manner, wherein each of the plurality of envelope modulators is configured to output an envelope voltage to a corresponding power amplifier in the Doherty power amplifier circuit.

12. The control apparatus according to claim 7, wherein the phase modulation is digital phase modulation or analog phase modulation.

13. A power amplifier control system, comprising:
a power amplifier system comprising an envelope control circuit and a Doherty power amplifier circuit, wherein the envelope control circuit comprises an envelope modulator configured to generate an envelope voltage according to an envelope signal output by a baseband unit, and output the envelope voltage to the Doherty power amplifier circuit as a supply voltage, wherein the Doherty power amplifier circuit comprises a main power amplifier and an auxiliary power amplifier separately configured to perform, according to the envelope voltage output by the envelope modulator, amplification processing on a baseband signal output by the baseband unit;
a signal generation unit configured to generate a phase modulation control signal according to the envelope signal output by the baseband unit; and
a signal phase modulation unit configured to perform phase modulation on a signal of a main power amplifier link and/or an auxiliary power amplifier link in the Doherty power amplifier circuit according to the generated phase modulation control signal, so that a phase difference between the signal of the main power amplifier link and the signal of the auxiliary power amplifier link after the phase modulation is a specified value corresponding to a current value of the envelope signal, wherein the specified value is an optimal phase value of the Doherty power amplifier circuit when the supply voltage of the Doherty power amplifier circuit is the envelope voltage corresponding to the current value of the envelope signal.

14. The control system according to claim 13, wherein the signal generation unit is configured to:
generate a first phase modulation control signal when the current value of the envelope signal is not greater than a specified envelope opening threshold, wherein the first phase modulation control signal is to be generated according to the envelope signal for enabling the phase difference between the signal of the main power amplifier link and the signal of the auxiliary power amplifier link after the phase modulation to be a first phase value that is an optimal phase value of the Doherty power amplifier circuit when the supply voltage of the Doherty power amplifier circuit is a minimum envelope voltage; or
generate a second phase modulation control signal when the current value of the envelope signal is a specified envelope signal maximum value, wherein the second phase modulation control signal is to be generated according to the envelope signal for enabling the phase difference between the signal of the main power amplifier link and the signal of the auxiliary power amplifier link after the phase modulation to be a second phase value that is an optimal phase value of the Doherty power amplifier circuit when the supply voltage of the Doherty power amplifier circuit is a maximum envelope voltage, wherein the specified envelope signal maximum value is greater than the specified envelope opening threshold; or
generate a third phase modulation control signal when the current value of the envelope signal is greater than a specified envelope opening threshold and less than a specified envelope signal maximum value, wherein the third phase modulation control signal is to be generated according to the envelope signal for enabling the phase difference between the signal of the main power amplifier link and the signal of the auxiliary power amplifier link after the phase modulation to be a third phase value that is obtained by performing a linear interpolation operation according to the current value of the envelope signal, a first phase value, a second phase value, an envelope opening threshold corresponding to the first phase value, and an envelope signal maximum value corresponding to the second phase value.

15. The control system according to claim 13, wherein the signal phase modulation unit is configured to:
perform the phase modulation on the signal of the main power amplifier link and/or the auxiliary power amplifier link in the Doherty power amplifier circuit after performing frequency conversion processing on a baseband signal corresponding to the main power amplifier link and/or the auxiliary power amplifier link in the Doherty power amplifier circuit; or
perform the phase modulation on the signal of the main power amplifier link and/or the auxiliary power amplifier link in the Doherty power amplifier circuit before performing frequency conversion processing on a baseband signal corresponding to the main power amplifier link and/or the auxiliary power amplifier link in the Doherty power amplifier circuit.

16. The control system according to claim 13, wherein the Doherty power amplifier circuit comprises one or more auxiliary power amplifiers in the Doherty power amplifier circuit, and the signal phase modulation unit is configured to perform phase modulation on a signal of each auxiliary power amplifier link in the Doherty power amplifier circuit when the Doherty power amplifier circuit comprises two or more auxiliary power amplifiers in the Doherty power amplifier circuit.

17. The control system according to claim 13, wherein the envelope control circuit comprises one envelope modulator separately connected to power amplifiers in the Doherty power amplifier circuit, wherein the one envelope modulator is configured to output an envelope voltage to the power amplifiers in the Doherty power amplifier circuit.

18. The control system according to claim 13, wherein the phase modulation is digital phase modulation.

19. The control system according to claim 13, wherein the envelope control circuit comprises a plurality of envelope modulators connected to power amplifiers in the Doherty power amplifier circuit in a one-to-one corresponding manner, wherein each of the plurality of envelope modulators is configured to output an envelope voltage to a corresponding power amplifier in the Doherty power amplifier circuit.

20. The control system according to claim 13, wherein the phase modulation is analog phase modulation.

\* \* \* \* \*